(12) United States Patent
Li et al.

(10) Patent No.: US 12,120,914 B2
(45) Date of Patent: Oct. 15, 2024

(54) DISPLAY DEVICE AND MANUFACTURING METHOD THEREOF

(71) Applicant: BOE TECHNOLOGY GROUP CO., LTD., Beijing (CN)

(72) Inventors: Dachao Li, Beijing (CN); Shengji Yang, Beijing (CN); Chen Xu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 1060 days.

(21) Appl. No.: 16/958,890

(22) PCT Filed: Aug. 23, 2019

(86) PCT No.: PCT/CN2019/102310
§ 371 (c)(1),
(2) Date: Jun. 29, 2020

(87) PCT Pub. No.: WO2021/035417
PCT Pub. Date: Mar. 4, 2021

(65) Prior Publication Data
US 2022/0376014 A1  Nov. 24, 2022

(51) Int. Cl.
H10K 59/121  (2023.01)
G09G 3/3233  (2016.01)
(Continued)

(52) U.S. Cl.
CPC ....... H10K 59/1213 (2023.02); G09G 3/3233 (2013.01); H10K 59/131 (2023.02);
(Continued)

(58) Field of Classification Search
None
See application file for complete search history.

(56) References Cited

U.S. PATENT DOCUMENTS 5,592,318 A  1/1997  Majima et al.
5,844,272 A  12/1998  Soederbaerg et al.
(Continued)

FOREIGN PATENT DOCUMENTS

CN  1231770 A  10/1999
CN  1530878 A  9/2004
(Continued)

OTHER PUBLICATIONS

Extended European Search Report in European Patent Application No. 19933218.0 dated Nov. 16, 2022.
(Continued)

Primary Examiner — Cory W Eskridge
(74) Attorney, Agent, or Firm — Collard & Roe, P.C.

(57) ABSTRACT

A display device and a manufacturing method thereof are disclosed. The display device includes a base substrate and at least one pixel circuit provided on the base substrate, and the pixel circuit includes a driving transistor, a first transistor, and a second transistor; the driving transistor includes a control electrode, a first electrode, and a second electrode; the first transistor includes a first active region, the second transistor includes a second active region, the driving transistor includes a fourth active region, at least one of a doping concentration of the first active region and a doping concentration of the second active region is greater than a doping concentration of the fourth active region.

19 Claims, 11 Drawing Sheets

(51) Int. Cl.
*H10K 59/131* (2023.01)
*H10K 71/00* (2023.01)
*H10K 59/12* (2023.01)

(52) U.S. Cl.
CPC ..... *H10K 71/00* (2023.02); *G09G 2300/0426* (2013.01); *G09G 2330/021* (2013.01); *H10K 59/1201* (2023.02)

(56) References Cited

U.S. PATENT DOCUMENTS

| | | | |
|---|---|---|---|
| 5,898,322 | A | 4/1999 | Kubota et al. |
| 5,907,173 | A | 5/1999 | Kwon et al. |
| 5,960,268 | A | 9/1999 | Aihara |
| 6,040,208 | A | 3/2000 | Honeycutt et al. |
| 6,274,421 | B1 | 8/2001 | Hsu et al. |
| 6,580,094 | B1 | 6/2003 | Yamazaki et al. |
| 6,897,525 | B1 | 5/2005 | Kikuchi et al. |
| 7,361,534 | B2 | 4/2008 | Pelella |
| 7,432,146 | B2 | 10/2008 | Yamamoto |
| 7,733,359 | B1 | 6/2010 | Hagge et al. |
| 7,838,883 | B2 | 11/2010 | Yamazaki et al. |
| 8,017,945 | B2 | 9/2011 | Yamazaki et al. |
| 8,772,766 | B2 | 7/2014 | Yamazaki et al. |
| 8,912,600 | B2 | 12/2014 | You |
| 9,023,678 | B2 | 5/2015 | Heo et al. |
| 9,236,408 | B2 | 1/2016 | Yamazaki |
| 9,286,830 | B2 | 3/2016 | Tsuge |
| 9,401,112 | B2 | 7/2016 | Ohara et al. |
| 9,711,549 | B2 | 7/2017 | Yamazaki et al. |
| 9,721,509 | B2 | 8/2017 | Kim et al. |
| 9,748,292 | B2 | 8/2017 | Yamazaki |
| 9,859,439 | B2 | 1/2018 | Miyairi |
| 9,875,690 | B2 | 1/2018 | Wang et al. |
| 10,050,062 | B2 | 8/2018 | Sasagawa et al. |
| 10,147,747 | B2 | 12/2018 | Toriumi et al. |
| 10,796,641 | B2 | 10/2020 | Yang et al. |
| 11,322,082 | B2 | 5/2022 | Hu et al. |
| 11,335,301 | B2 | 5/2022 | Wang |
| 2002/0084463 | A1 | 7/2002 | Sanford et al. |
| 2002/0179908 | A1 | 12/2002 | Arao |
| 2003/0025659 | A1 | 2/2003 | Kondo et al. |
| 2003/0030144 | A1 | 2/2003 | Ono et al. |
| 2003/0153155 | A1 | 8/2003 | Wang et al. |
| 2003/0156210 | A1 | 8/2003 | Wako et al. |
| 2004/0189625 | A1 | 9/2004 | Sato |
| 2005/0018110 | A1 | 1/2005 | Liu |
| 2005/0093789 | A1* | 5/2005 | Kim ............... G09G 3/3233 345/76 |
| 2005/0173761 | A1 | 8/2005 | Takafuji et al. |
| 2005/0245046 | A1 | 11/2005 | Takafuji et al. |
| 2006/0170634 | A1 | 8/2006 | Kwak et al. |
| 2006/0205166 | A1 | 9/2006 | Ishikiriyama |
| 2006/0258110 | A1 | 11/2006 | Pelella |
| 2007/0164290 | A1 | 7/2007 | Yamazaki et al. |
| 2007/0295961 | A1 | 12/2007 | Kim |
| 2008/0142807 | A1 | 6/2008 | Choe et al. |
| 2008/0169757 | A1 | 7/2008 | Chang et al. |
| 2008/0191603 | A1 | 8/2008 | Kubota |
| 2008/0210928 | A1 | 9/2008 | Abe et al. |
| 2009/0114926 | A1 | 5/2009 | Yamazaki |
| 2009/0152625 | A1 | 6/2009 | Lee et al. |
| 2010/0025664 | A1 | 2/2010 | Park |
| 2010/0289732 | A1 | 11/2010 | Ina et al. |
| 2011/0233553 | A1 | 9/2011 | Sakakura et al. |
| 2011/0260951 | A1 | 10/2011 | Hwang et al. |
| 2011/0291550 | A1 | 12/2011 | Kim et al. |
| 2012/0007848 | A1 | 1/2012 | Han et al. |
| 2012/0039034 | A1 | 2/2012 | Jepsen et al. |
| 2012/0091527 | A1* | 4/2012 | You ............... H01L 29/0878 257/E29.256 |
| 2012/0105421 | A1 | 5/2012 | Tsai et al. |
| 2012/0235973 | A1 | 9/2012 | Yoo |
| 2013/0001601 | A1 | 1/2013 | Lee et al. |
| 2013/0328753 | A1 | 12/2013 | Tsuge |
| 2014/0034982 | A1 | 2/2014 | Yamazaki |
| 2014/0131717 | A1 | 5/2014 | Qi et al. |
| 2014/0159021 | A1 | 6/2014 | Song et al. |
| 2014/0252321 | A1 | 9/2014 | Pyon et al. |
| 2014/0299867 | A1 | 10/2014 | Ono et al. |
| 2014/0312334 | A1 | 10/2014 | Yamazaki et al. |
| 2014/0361276 | A1 | 12/2014 | Hsu et al. |
| 2014/0367652 | A1 | 12/2014 | Cho et al. |
| 2015/0108470 | A1 | 4/2015 | Yamazaki et al. |
| 2015/0108475 | A1 | 4/2015 | Ando et al. |
| 2015/0115224 | A1 | 4/2015 | Kou |
| 2015/0270326 | A1 | 9/2015 | Hekmatshoartabari et al. |
| 2015/0287818 | A1 | 10/2015 | Yen et al. |
| 2015/0348997 | A1 | 12/2015 | Sasagawa et al. |
| 2016/0126296 | A1 | 5/2016 | Feng |
| 2016/0172431 | A1 | 6/2016 | Huang et al. |
| 2016/0181350 | A1 | 6/2016 | Lee |
| 2016/0275870 | A1 | 9/2016 | Kimura et al. |
| 2016/0293105 | A1* | 10/2016 | Wang ............... G09G 3/3258 |
| 2016/0322442 | A1 | 11/2016 | Lee et al. |
| 2016/0327842 | A1 | 11/2016 | Qiao et al. |
| 2016/0351589 | A1 | 12/2016 | Sasagawa et al. |
| 2016/0357076 | A1 | 12/2016 | Huangfu et al. |
| 2016/0372711 | A1 | 12/2016 | Song et al. |
| 2017/0011685 | A1 | 1/2017 | Jeon |
| 2017/0047004 | A1 | 2/2017 | Yoon et al. |
| 2017/0092707 | A1 | 3/2017 | Wang |
| 2017/0193879 | A1 | 7/2017 | Wang |
| 2017/0236885 | A1 | 8/2017 | Koshihara et al. |
| 2017/0263783 | A1 | 9/2017 | Yamazaki et al. |
| 2017/0294491 | A1 | 10/2017 | Jo et al. |
| 2017/0301293 | A1 | 10/2017 | Zhu et al. |
| 2018/0006149 | A1 | 1/2018 | Kim et al. |
| 2018/0088260 | A1 | 3/2018 | Jin et al. |
| 2018/0102092 | A1 | 4/2018 | Kubota et al. |
| 2018/0151827 | A1 | 5/2018 | Kang et al. |
| 2018/0212011 | A1 | 7/2018 | Lai et al. |
| 2019/0066564 | A1 | 2/2019 | Tan |
| 2019/0189053 | A1 | 6/2019 | Kim et al. |
| 2019/0251905 | A1* | 8/2019 | Yang ............... G09G 3/3258 |
| 2019/0386074 | A1 | 12/2019 | Li et al. |
| 2020/0082757 | A1 | 3/2020 | Yuan et al. |
| 2021/0233968 | A1 | 7/2021 | Yang et al. |

FOREIGN PATENT DOCUMENTS

| | | |
|---|---|---|
| CN | 1625314 A | 6/2005 |
| CN | 101192382 A | 6/2008 |
| CN | 101656215 A | 2/2010 |
| CN | 101833186 A | 9/2010 |
| CN | 101980330 A | 2/2011 |
| CN | 102760841 A | 10/2012 |
| CN | 102881703 A | 1/2013 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104240633 A | 12/2014 |
| CN | 104299572 A | 1/2015 |
| CN | 104332561 A | 2/2015 |
| CN | 104380368 A | 2/2015 |
| CN | 104597655 A | 5/2015 |
| CN | 104681624 A | 6/2015 |
| CN | 104701373 A | 6/2015 |
| CN | 104979395 A | 10/2015 |
| CN | 105185816 A | 12/2015 |
| CN | 105225633 A | 1/2016 |
| CN | 105280139 A | 1/2016 |
| CN | 204966501 U | 1/2016 |
| CN | 105304679 A | 2/2016 |
| CN | 205355055 U | 6/2016 |
| CN | 106159100 A | 11/2016 |
| CN | 205789046 U | 12/2016 |
| CN | 106601167 A | 4/2017 |
| CN | 106782307 A | 5/2017 |
| CN | 107086237 A | 8/2017 |

(56) References Cited

FOREIGN PATENT DOCUMENTS

| | | |
|---|---|---|
| CN | 107103878 A | 8/2017 |
| CN | 107134461 A | 9/2017 |
| CN | 107393468 A | 11/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109119027 A | 1/2019 |
| CN | 109215549 A | 1/2019 |
| CN | 109448639 A | 3/2019 |
| CN | 109509430 A | 3/2019 |
| CN | 109904347 A | 6/2019 |
| CN | 109935633 A | 6/2019 |
| CN | 109949743 A | 6/2019 |
| CN | 110071229 A | 7/2019 |
| CN | 110120346 A | 8/2019 |
| EP | 1 096 571 A2 | 5/2001 |
| EP | 2 680 310 A1 | 1/2014 |
| EP | 3 693 953 A1 | 8/2020 |
| IN | 104201190 A | 12/2014 |
| JP | H06-347828 A | 12/1994 |
| JP | 2000-315734 A | 11/2000 |
| JP | 2001-195016 A | 7/2001 |
| JP | 2001-332383 A | 11/2001 |
| JP | 2007-156058 A | 6/2007 |
| JP | 2008-153191 A | 7/2008 |
| JP | 2009-003435 A | 1/2009 |
| JP | 2009-016410 A | 1/2009 |
| JP | 2009-036948 A | 2/2009 |
| JP | 2011-181938 A | 9/2011 |
| KR | 10-2008-0101732 A | 11/2008 |
| KR | 10-1645404 B1 | 8/2016 |
| KR | 10-2017-0005252 A | 1/2017 |
| KR | 10-2018-0000357 A | 1/2018 |
| RU | 2 453 879 C2 | 6/2012 |

OTHER PUBLICATIONS

Final Office Action in U.S. Appl. No. 16/959,757 dated Dec. 1, 2022.
First Office Action in U.S. Appl. No. 16/959,398 dated Nov. 26, 2021.
First Office Action in U.S. Appl. No. 16/812,619 dated Jan. 7, 2022.
First Office Action in U.S. Appl. No. 16/814,119 dated Apr. 20, 2022.
First Office Action in Chinese Application No. 201980001452.2 dated May 11, 2022, with English translation.
Final Office Action in U.S. Appl. No. 16/812,619 dated May 16, 2022.
First Office Action in Indian Application No. 202017056071 dated May 17, 2022.
First Office Action in U.S. Appl. No. 16/959,757 dated May 27, 2022.
Extended European Search Report in European Patent Application No. 19931503.7 dated May 30, 2022.
Extended European Search Report in European Application No. 19932239.7 dated Aug. 1, 2022.
Extended European Search Report in European Application No. 19933232.1 dated Sep. 6, 2022.
Japanese Office Action in Japanese Application No. 2017-521204, mailed Jan. 20, 2021 with English translation.
U.S. Office Action in U.S. Appl. No. 16/916,671 dated Feb. 24, 2022.
First Indian Office Action in Indian Application No. 202017056357 dated Mar. 29, 2022 with English translation.
First Indian Office Action in Indian Application No. 202017056072 dated Apr. 7, 2022 with English translation.
International Search Report of PCT/CN2019/102310 in Chinese, mailed May 9, 2020 with English Translation.
Chinese Office Action in Chinese Application No. 201980001517.3 dated Sep. 1, 2021 with English translation.
U.S. Office Action in U.S. Appl. No. 16/916,671 dated Oct. 1, 2021.
U.S. Office Action in U.S. Appl. No. 16/960,729 dated Jul. 25, 2022.
English translation of the International Search Report of PCT/CN2016/101999, mailed Jan. 18, 2017.
English translation of the Notice of Transmittal of the International Search Report of PCT/CN2016/101999, mailed Jan. 18, 2017.
International Preliminary Report on Patentability of PCT/CN2016/101999, issuance date Apr. 17, 2018 and English Translation of the Written Opinion of the International Searching Authority of PCT/CN2016/101999, mailed Jan. 18, 2017.
International Search Report of PCT/CN2019/102314 in Chinese, mailed May 27, 2020, with English translation.
Notice of Transmittal of the International Search Report of PCT/CN2019/102314 in Chinese, mailed May 27, 2020.
Written Opinion of the International Searching Authority of PCT/CN2019/102314 in Chinese, mailed May 27, 2020 with English translation.
International Search Report of PCT/CN2019/102293 in Chinese, mailed Apr. 26, 2020, with English translation.
Notice of Transmittal of the International Search Report of PCT/CN2019/102293 in Chinese, mailed Apr. 26, 2020.
Written Opinion of the International Searching Authority of PCT/CN2019/102293 in Chinese, mailed Apr. 26, 2020 with English translation.
International Search Report of PCT/CN2019/102307 in Chinese, mailed May 26, 2020, with English translation.
Notice of Transmittal of the International Search Report of PCT/CN2019/102307 in Chinese, mailed May 26, 2020.
Written Opinion of the International Searching Authority of PCT/CN2019/102307 in Chinese, mailed May 26, 2020 with English translation.
International Search Report of PCT/CN2019/102819 in Chinese, mailed May 26, 2020, with English translation.
Notice of Transmittal of the International Search Report of PCT/CN2019/102819 in Chinese, mailed May 26, 2020.
Written Opinion of the International Searching Authority of PCT/CN2019/102819 in Chinese, mailed May 26, 2020 with English translation.
Non-Final Office Action in U.S. Appl. No. 15/521,612 dated Jul. 6, 2018.
Non-Final Office Action in U.S. Appl. No. 15/521,612 dated Mar. 29, 2019.
Final Office Action in U.S. Appl. No. 15/521,612 dated Jan. 14, 2019.
Final Office Action in U.S. Appl. No. 15/521,612 dated Oct. 1, 2019.
Notice of Allowance in U.S. Appl. No. 16/234,777, dated Sep. 1, 2020.
Non-Final Office Action in U.S. Appl. No. 16/492,930 dated Jul. 24, 2020.
English translation of Extended European Search Report in EP Application No. 16852868.5 mailed May 9, 2019.
English translation of Extended European Search Report in EP Application No. 17768339.8 mailed Dec. 6, 2019.
Korean Office Action in Korean Application No. 10-2017-7009789, mailed Aug. 20, 2018 with English translation.
Korean Notice of Allowance in Korean Application No. 10-2019-7009729, mailed May 8, 2019 with English translation.
Japanese Search Report in Japanese Application No. 2017-521204 mailed Apr. 1, 2020 with English translation.
Japanese Office Action in Japanese Application No. 2017-521204, mailed Jun. 8, 2020 with English translation.
Russian Notice of Allowance in Russian Application No. 2019130488, mailed Mar. 18, 2020 with English Translation.
Chinese Office Action in Chinese Application No. 201810135947.1, mailed Mar. 3, 2020 with English translation.
International Search Report of PCT/CN2019/102310 in Chinese, mailed May 9, 2020.
Notice of Transmittal of the International Search Report of PCT/CN2019/102310 in Chinese, mailed May 9, 2020.
Written Opinion of the International Searching Authority of PCT/CN2019/102310 in Chinese, mailed May 9, 2020.

(56) References Cited

OTHER PUBLICATIONS

U.S. Office Action in U.S. Appl. No. 17/826,664 dated Dec. 21, 2023.
U.S. Office Action in U.S. Appl. No. 17/852,485 dated Dec. 29, 2023.
Chinese Office Action in Chinese Application No. 201980001449.0 dated Jun. 26, 2024.

* cited by examiner

DISPLAY DEVICE AND MANUFACTURING METHOD THEREOF

CROSS REFERENCE TO RELATED APPLICATIONS

This application is the National Stage of PCT/CN2019/102310 filed on Aug. 23, 2019, the disclosure of which is incorporated by reference.

TECHNICAL FIELD

Embodiments of the present disclosure relate to a display device and a manufacturing method thereof.

BACKGROUND

The micro organic light-emitting diode (Micro-OLED) display device is a new type of OLED display device that uses a silicon substrate as a substrate, and is also called a silicon-based organic light-emitting diode (silicon-based OLED) display device. The silicon-based OLED display device has the advantages of small size and high resolution, and is manufactured using a mature CMOS integrated circuit process, which can realize active addressing of pixels, and can manufacture a variety of functional circuits including a TCON (timing control) circuit, a OCP (Operation Control) circuit, and the like on the silicon substrate, thereby implementing light weight.

SUMMARY

At least an embodiment of the present disclosure provides a display device, comprising a base substrate and at least one pixel circuit provided on the base substrate, and the pixel circuit comprises a driving transistor, a first transistor, and a second transistor; the driving transistor comprises a control electrode, a first electrode, and a second electrode, and is configured to control a driving current, flowing through the first electrode of the driving transistor and the second electrode of the driving transistor, for driving a light-emitting element to emit light according to a voltage of the control electrode of the driving transistor; the first transistor is connected to the control electrode of the driving transistor, and is configured to write a data signal to the control electrode of the driving transistor in response to a first scan signal; the second transistor is connected to the control electrode of the driving transistor, and is configured to write the data signal to the control electrode of the driving transistor in response to a second scan signal; and the first transistor comprises a first active region, the second transistor comprises a second active region, the driving transistor comprises a fourth active region, at least one of a doping concentration of the first active region and a doping concentration of the second active region is greater than a doping concentration of the fourth active region.

For example, in the display device provided by an embodiment of the present disclosure, the doping concentration of the first active region and the doping concentration of the second active region are both greater than the doping concentration of the fourth active region.

For example, in the display device provided by an embodiment of the present disclosure, the pixel circuit further comprises a third transistor, and the third transistor is connected to the first electrode of the driving transistor, and is configured to apply a first power supply voltage to the first electrode of the driving transistor in response to a light-emitting control signal; and the third transistor comprises a third active region, and the doping concentration of the fourth active region is smaller than a doping concentration of the third active region.

For example, in the display device provided by an embodiment of the present disclosure, the doping concentration of the fourth active region is 4 orders of magnitude smaller than the doping concentration of the third active region.

For example, in the display device provided by an embodiment of the present disclosure, the doping concentration of the third active region comprises $10^{17}$ cm$^{-3}$, and the doping concentration of the fourth active region comprises $10^{13}$ CM$^{-3}$.

For example, in the display device provided by an embodiment of the present disclosure, the doping concentration of the first active region and the doping concentration of the second active region are both 3 orders of magnitude greater than the doping concentration of the third active region.

For example, in the display device provided by an embodiment of the present disclosure, the doping concentration of the third active region comprises $10^{17}$ cm$^{-3}$, and the doping concentration of the first active region and the doping concentration of the second active region both comprise $10^{20}$ CM$^{-3}$.

For example, in the display device provided by an embodiment of the present disclosure, the first transistor is a MOS transistor with a first semiconductor type, the second transistor, the third transistor, and the driving transistor are all MOS transistors with a second semiconductor type, and a doping type of the first semiconductor type is opposite to a doping type of the second semiconductor type.

For example, in the display device provided by an embodiment of the present disclosure, a direction from a first electrode of the first transistor to a second electrode of the first transistor is a first direction, a direction from a first electrode of the second transistor to a second electrode of the second transistor is a second direction, a direction from a first electrode of the third transistor to a second electrode of the third transistor is a third direction, and a direction from the first electrode of the driving transistor to the second electrode of the driving transistor is a fourth direction; and at least one of the first direction, the second direction, and the third direction intersects with the fourth direction.

For example, in the display device provided by an embodiment of the present disclosure, the first direction, the second direction, and the third direction are all perpendicular to the fourth direction.

For example, in the display device provided by an embodiment of the present disclosure, a first electrode of the first transistor and a first electrode of the second transistor are connected to obtain a common electrode, and are connected to the control electrode of the driving transistor through the common electrode; a control electrode of the first transistor is configured to receive the first scan signal, and a second electrode of the first transistor is configured to receive the data signal; a control electrode of the second transistor is configured to receive the second scan signal, and a second electrode of the second transistor is configured to receive the data signal; a control electrode of the third transistor is configured to receive the light-emitting control signal, a first electrode of the third transistor is configured to receive the first power supply voltage, and a second electrode of the third transistor is connected to the first electrode of the driving transistor; and the second electrode of the driving transistor is configured to be connected to the light-emitting element.

For example, in the display device provided by an embodiment of the present disclosure, the pixel circuit further comprises a storage capacitor, a first electrode of the storage capacitor is connected to the control electrode of the driving transistor, and a second electrode of the storage capacitor is configured to receive a third power supply voltage.

For example, the display device provided by an embodiment of the present disclosure further comprises a first scan signal line for transmitting the first scan signal and a second scan signal line for transmitting the second scan signal, and an orthographic projection of the first scan signal line on the base substrate is parallel to an orthographic projection of the second scan signal line on the base substrate.

For example, in the display device provided by an embodiment of the present disclosure, an extension direction of the first scan signal line and an extension direction of the second scan signal line are both parallel to the fourth direction.

For example, the display device provided by an embodiment of the present disclosure further comprises a data line for transmitting the data signal, and the orthographic projection of the second scan signal line on the base substrate at least partially overlaps with an orthographic projection of the data line on the base substrate.

For example, the display device provided by an embodiment of the present disclosure further comprises a first power supply voltage line for transmitting a first power supply voltage and a light-emitting control line for transmitting a light-emitting control signal, an extension direction of a part of the first power supply voltage line and an extension direction of a part of the light-emitting control line are parallel to the fourth direction, and the orthographic projection of the first scan signal line on the base substrate, the orthographic projection of the second scan signal line on the base substrate, an orthographic projection of the first power supply voltage line on the base substrate, and an orthographic projection of the light-emitting control line on the base substrate are sequentially arranged in a direction perpendicular to the fourth direction.

For example, the display device provided by an embodiment of the present disclosure further comprises a second power supply voltage line for transmitting a second power supply voltage, and the first transistor is electrically connected to the second power supply voltage line to receive the second power supply voltage.

For example, in the display device provided by an embodiment of the present disclosure, an orthographic projection of the second power supply voltage line on the base substrate is between the orthographic projection of the first power supply voltage line on the base substrate and the orthographic projection of the light-emitting control line on the base substrate, and an extension direction of a part of the second power supply voltage line is parallel to the fourth direction.

For example, the display device provided by an embodiment of the present disclosure further comprises a first transfer electrode provided at a first side of the light-emitting control line, and a second transfer electrode extending from the first side of the light-emitting control line to a second side of the light-emitting control line, an orthographic projection of the second transfer electrode on the base substrate crosses the orthographic projection of the light-emitting control line on the base substrate, two ends of the first transfer electrode are respectively electrically connected to a first electrode of the first transistor and a first electrode of the second transistor, the first transfer electrode is electrically connected to the second transfer electrode, and the second transfer electrode is electrically connected to the control electrode of the driving transistor.

For example, in the display device provided by an embodiment of the present disclosure, an extension direction of the second transfer electrode is perpendicular to an extension direction of the first transfer electrode, and is perpendicular to the fourth direction.

For example, in the display device provided by an embodiment of the present disclosure, an orthographic projection of a first active region of the first transistor on the base substrate and an orthographic projection of a second active region of the second transistor on the base substrate are both between the orthographic projection of the second scan signal line on the base substrate and the orthographic projection of the light-emitting control line on the base substrate; the orthographic projection of the first active region of the first transistor on the base substrate intersects with the orthographic projection of the first power supply voltage line on the base substrate, and the orthographic projection of the first active region of the first transistor on the base substrate intersects with the orthographic projection of the second power supply voltage line on the base substrate; and the orthographic projection of the second active region of the second transistor on the base substrate intersects with the orthographic projection of the first power supply voltage line on the base substrate, and the orthographic projection of the second active region of the second transistor on the base substrate intersects with the orthographic projection of the second power supply voltage line on the base substrate.

For example, the display device provided by an embodiment of the present disclosure further comprises a driving circuit on the base substrate, and the driving circuit is configured to provide the first scan signal, the second scan signal, and a light-emitting control signal to the at least one pixel circuit.

At least an embodiment of the present disclosure further provides a manufacturing method of a display device, comprising forming a pixel circuit on a base substrate, and the pixel circuit comprises a driving transistor, a first transistor, and a second transistor; the driving transistor comprises a control electrode, a first electrode, and a second electrode, and is configured to control a driving current, flowing through the first electrode of the driving transistor and the second electrode of the driving transistor, for driving a light-emitting element to emit light according to a voltage of the control electrode of the driving transistor; the first transistor is connected to the control electrode of the driving transistor, and is configured to write a data signal to the control electrode of the driving transistor in response to a first scan signal; the second transistor is connected to the control electrode of the driving transistor, and is configured to write the data signal to the control electrode of the driving transistor in response to a second scan signal; the first transistor comprises a first active region, the second transistor comprises a second active region, the driving transistor comprises a fourth active region; and the manufacturing method further comprises: doping the first active region, the second active region, and the fourth active region so that at least one of a doping concentration of the first active region and a doping concentration of the second active region is greater than a doping concentration of the fourth active region.

For example, in the manufacturing method provided by an embodiment of the present disclosure, the pixel circuit further comprises a third transistor, the third transistor is connected to the first electrode of the driving transistor, and is configured to apply a first power supply voltage to the first electrode of the driving transistor in response to a light-emitting control signal; and the third transistor comprises a third active region; and the manufacturing method further comprises doping the third active region so that the doping concentration of the fourth active region is smaller than a doping concentration of the third active region.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, silicon-based OLED display panels are widely used in the field of near-eye display such as virtual reality (VR) or augmented reality (AR), and users are increasingly demanding better display quality, for example, need to achieve higher resolution and PPI (Pixels Per Inch). In order to achieve higher PPI, the layout of a display device needs to be designed to reduce the layout area that is occupied, so that more pixel units can be provided in the display region of the same size, thereby achieving high PPI.

The display device and the manufacturing method thereof provided by at least one embodiment of the present disclosure can reduce the layout area occupied by the display device through layout design, so that the display device can more easily achieve high PPI. In addition, at least one embodiment of the present disclosure further provides a structural design of a transistor that can reduce or avoid the risk of breakdown under the action of a high voltage.

The embodiments of the present disclosure will be described in detail below with reference to the drawings.

Figure 1:
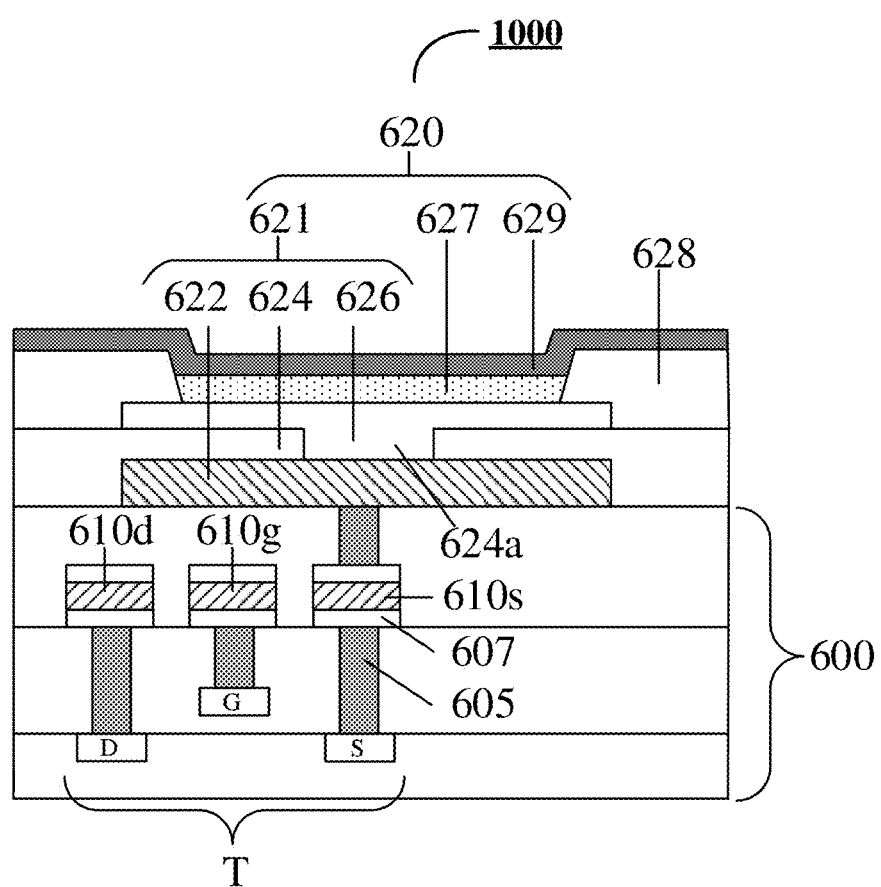
FIG. 1 is a schematic cross-sectional diagram of a display substrate.

FIG. 1 is a schematic structural diagram of a display substrate 1000. As illustrated in FIG. 1, the display substrate 1000 includes a base substrate 600 and a light-emitting element 620. For example, the light-emitting element 620 is provided on the base substrate 600, and a first electrode 621 of the light-emitting element 620 is closer to the base substrate 600 than a second electrode 629 of the light-emitting element 620.

For example, in some examples, the base substrate 600 is a silicon-based base substrate, and the embodiments of the present disclosure include but are not limited this case. For example, the semiconductor manufacturing process used on silicon-based substrates is mature and has stable performance, which is beneficial to the manufacture of micro display devices.

For example, in some examples, the silicon-based base substrate 600 includes a driving circuit, and the driving circuit is electrically connected to the light-emitting element 620 for driving the light-emitting element 620 to emit light. For example, as illustrated in FIG. 1, the driving circuit includes a transistor T. It should be noted that the specific circuit structure of the driving circuit may be set according to actual needs. For example, FIG. 1 does not illustrate the entire structure of the driving circuit, the driving circuit may further include, for example, other transistors, and for another example, a storage capacitor, etc., and the embodiments of the present disclosure are not limited in this aspect.

For example, as illustrated in FIG. 1, the transistor T includes a gate electrode G, a source electrode S, and a drain electrode D. The three electrodes respectively correspond to three electrode connection portions. For example, the gate electrode G is electrically connected to a gate electrode connection portion 610g, the source electrode S is electrically connected to a source electrode connection portion 610s, and the drain electrode D is electrically connected to a drain electrode connection portion 610d. For example, the three electrodes are correspondingly electrically connected to the three electrode connection portions through tungsten via holes 605.

For example, as illustrated in FIG. 1, the source electrode connection portion 610s is electrically connected to the first electrode 621 of the light-emitting element 620 through a tungsten via hole. For example, the source electrode connection portion 610s is electrically connected to a metal reflective layer 622 of the first electrode 621 through the tungsten via hole, and in the first electrode 621, a transparent conductive layer 626 is electrically connected to the metal reflective layer 622 through a via hole 624a in an inorganic insulating layer 624. In the case where the transistor T is in a turn-on state, an electrical signal provided by a power supply line can be transmitted to the transparent conductive layer 626 through the source electrode S of the transistor T, the source electrode connection portion 610s, and the metal reflective layer 622. Because a voltage difference is formed between the transparent conductive layer 626 and the second electrode 629, an electric field is formed between the transparent conductive layer 626 and the second electrode 629, holes and electrons are injected into a light-emitting functional layer 627, and the light-emitting functional layer 627 emits light under the action of the electric field. It can be understood that in the transistor T, the positions of the source electrode S and the drain electrode D are interchangeable (correspondingly, the positions of the source electrode connection portion 610s and the drain electrode connection portion 610d are also interchangeable), that is, the light-emitting element 620 and one of the source electrode S and the drain electrode D of the transistor (that is, the source electrode S or the drain electrode D) may be electrically connected to each other.

For example, the materials of the gate electrode connection portion 610g, the source electrode connection portion 610s, and the drain electrode connection portion 610d may include metal materials. For example, as illustrated in FIG. 1, an anti-oxidation layer 607 may be provided on at least one side (for example, an upper side and/or a lower side) of each of the gate electrode connection part 610g, the source electrode connection part 610s, and the drain electrode connection part 610d, which can effectively prevent these electrode connection portions from being oxidized and improve conductivity of these electrode connection portions.

For example, as illustrated in FIG. 1, the display substrate 1000 further includes a defining layer 628 for defining the light-emitting functional layer 627, and the defining layer 628 defines the light-emitting functional layer 627 in an opening 728a so as to avoid the crosstalk of sub-pixels which are adjacent to each other.

It should be noted that, in the display substrate 1000 illustrated in FIG. 1, the via hole 624a in the inorganic insulating layer 624 may be disposed between the transparent conductive layer 626 and an edge region of the metal reflective layer 622. For example, in some examples, the orthographic projection of the light-emitting functional layer 627 on the base substrate 600 and the orthographic projection of the via hole 624a on the base substrate 600 are both within the orthographic projection of the metal reflective layer 622 on the base substrate 600, and there is no overlap between the orthographic projection of the light-emitting functional layer 627 on the base substrate 600 and the orthographic projection of the via hole 624a on the base substrate 600, so that when the metal reflective layer reflects the light emitted by the light-emitting functional layer 627, the via hole 624a has basically no effect on the reflection process.

At least one embodiment of the present disclosure provides a display device 100, and the display device 100 includes a base substrate and at least one pixel circuit provided on the base substrate and a light-emitting element driven by the pixel circuit. The base substrate is, for example, a silicon-based base substrate, which may be a bulk silicon substrate or a silicon-on-insulator (SOI) substrate. The pixel circuit may be manufactured in the base substrate by a silicon semiconductor process (for example, a CMOS process), and the light-emitting element is manufactured on a silicon substrate having the pixel circuit.

The display device 100 is described below with reference to FIG. 2 and FIG. 3. It should be noted that the base substrate is not illustrated in FIG. 2 and FIG. 3. For the base substrate, reference may be made to the base substrate 600 illustrated in FIG. 1.

Figure 2:
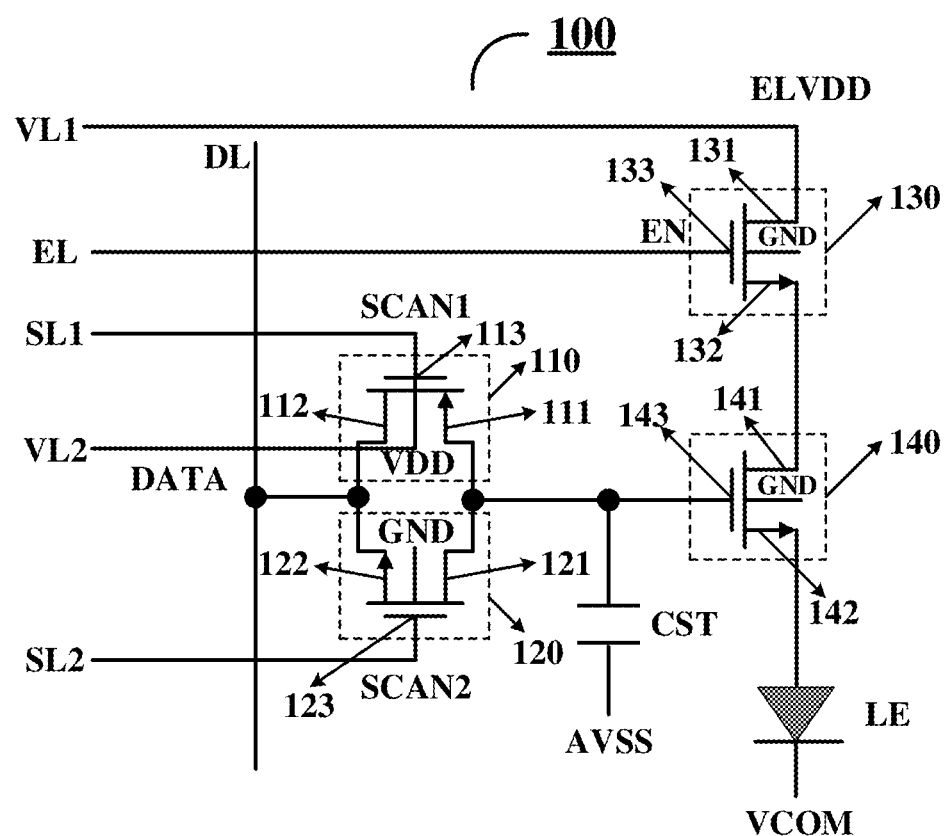
FIG. 2 is a circuit diagram of a display device provided by at least one embodiment of the present disclosure.

As illustrated in FIG. 2, the pixel circuit includes a driving transistor 140, a first transistor 110, a second transistor 120 and a third transistor 130. It should be noted that, in some embodiments, the pixel circuit may not include the third transistor 130, and the embodiments of the present disclosure are not limited in this aspect.

For example, the driving transistor 140 includes a control electrode 143, a first electrode 141, and a second electrode 142, and the driving transistor 140 is configured to control a driving current, which flows through the first electrode 141 of the driving transistor 140 and the second electrode 142 of the driving transistor 140, for driving a light-emitting element LE to emit light according to the voltage of the control electrode 143 of the driving transistor 140. The light-emitting element LE can emit light of different intensities according to the magnitude of the driving current.

It should be noted that, the source electrode and drain electrode of the transistor used in the embodiment of the present disclosure may be symmetrical in structure, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode, so that in the embodiments of the present disclosure, the first electrodes and the second electrodes of all or part of the transistors are interchangeable as needed. For example, the first electrodes of the transistors described in the embodiments of the present disclosure may be source electrodes and the second electrodes may be drain electrodes; or, the first electrodes of the transistors may be drain electrodes and the second electrodes may be source electrodes. The following embodiments are described by taking the case where the first electrodes of the transistors may be drain electrodes and the second electrodes may be source electrodes as an example, and are not repeated here for simplicity.

For example, the first transistor 110 is connected to the control electrode 143 of the driving transistor 140 and is configured to write a data signal DATA to the control electrode 143 of the driving transistor 140 in response to a first scan signal SCAN1.

For example, the second transistor 120 is connected to the control electrode 143 of the driving transistor 140 and is configured to write the data signal DATA to the control electrode 143 of the driving transistor 140 in response to a second scan signal SCAN2.

For example, the third transistor 130 is connected to the first electrode 141 of the driving transistor 140 and is configured to apply a first power supply voltage ELVDD to the first electrode 141 of the driving transistor 140 in response to a light-emitting control signal EN. For example, the first power supply voltage ELVDD in the embodiments of the present disclosure is a high-level voltage, and for example, the first power supply voltage ELVDD is at 5V.

As illustrated in FIG. 2, in some embodiments, the first electrode 111 (for example, a drain electrode) of the first transistor 110 and the first electrode 121 (for example, a drain electrode) of the second transistor 120 are connected to obtain a common electrode, and are connected to the control electrode 143 of the driving transistor 140 through the common electrode.

In the above embodiment, a first scan signal line SL1, a second scan signal line SL2, a data line DL, a first power supply voltage line VL1, a light-emitting control line EL, etc. are further provided to provide corresponding electrical signals. A control electrode 113 of the first transistor 110 is configured to receive the first scan signal SCAN1 from the first scan signal line SL1, and a second electrode 112 (for example, a source electrode) of the first transistor 110 is configured to receive the data signal DATA from the data line DL. A control electrode 123 of the second transistor 120 is configured to receive the second scan signal SCAN2 from the second scan signal line SL2, and a second electrode 122 (for example, a source electrode) of the second transistor 120 is configured to receive the data signal DATA from the data line DL. A control electrode 133 of the third transistor 130 is configured to receive the light-emitting control signal EN from the light-emitting control line EL, a first electrode 131 (for example, a drain electrode) of the third transistor 130 is configured to receive the first power supply voltage ELVDD from the first power supply voltage line VL1, and a second electrode 132 (for example, a source electrode) of the third transistor 130 is connected to the first electrode 141 (for example, a drain electrode) of the driving transistor 140.

A second electrode 142 (for example, a source electrode) of the driving transistor 140 is configured to be connected to a first electrode of the light-emitting element LE. For example, in the case where the light-emitting element LE is an OLED, the second electrode 142 of the driving transistor 140 may be connected to the anode of the OLED. For example, a second electrode of the light-emitting element LE is configured to receive a fourth power supply voltage VCOM. For example, the fourth power supply voltage VCOM in the embodiments of the present disclosure is a low-level voltage.

For example, in the embodiments of the present disclosure, the light-emitting element LE may adopt an OLED. In the case where a plurality of pixel units constitute a pixel array in the display panel, the second electrodes (for example, cathode) of a plurality of light-emitting elements OLED in the plurality of pixel units may be electrically connected together, for example, connected to the same electrode or integrally formed to receive the fourth power supply voltage VCOM, that is, the plurality of light-emitting elements OLED in the plurality of pixel units adopt a common cathode connection together.

For example, the light-emitting element OLED may be of various types, such as top emission, bottom emission, etc., and may emit red light, green light, blue light, or white light, etc. The embodiments of the present disclosure are not limited in this aspect.

For example, as illustrated in FIG. 2, the pixel circuit further includes a storage capacitor CST to store the data signal DATA that is written to the control electrode 143 of the driving transistor 140, so that the driving transistor 140 can control the magnitude of the driving current, which drives the light-emitting element LE, according to the voltage of the data signal DATA that is stored. A first electrode of the storage capacitor CST is connected to the control electrode 143 of the driving transistor 140, and a second electrode of the storage capacitor CST is configured to receive a third power supply voltage AVSS. For example, the third power supply voltage AVSS in the embodiments of the present disclosure is a low-level voltage. It should be noted that, in the embodiments of the present disclosure, the third power supply voltage AVSS may be the same as the fourth power supply voltage VCOM, for example, the third power supply voltage AVSS and the fourth power supply voltage VCOM may both be grounded, and the embodiments of the present disclosure include but are not limited to this case.

As illustrated in FIG. 2, in some embodiments of the present disclosure, the first transistor 110 may adopt a P-type MOS transistor, and the second transistor 120, the third transistor 130, and the driving transistor 140 may adopt an N-type MOS transistor. For example, the first transistor 110, the second transistor 120, the third transistor 130, and the driving transistor 140 are formed inside the base substrate.

For example, as illustrated in FIG. 2, a third electrode of the first transistor 110 is configured to receive a second power supply voltage VDD, and for example, the third electrode of the first transistor 110 is connected to a second power supply voltage line VL2 to receive the second power supply voltage VDD.

For example, the third electrode of the second transistor 120, the third electrode of the third transistor 130, and the third electrode of the driving transistor 140 are configured to be grounded (GND). It should be noted that, in the embodiments of the present disclosure, the third electrode of a transistor is opposite to the control electrode (gate electrode) of the transistor. The following embodiments are the same and will not repeated here for simplicity.

In the embodiments of the present disclosure, because the first transistor 110 and the second transistor 120 adopt MOS transistors having opposite semiconductor types, the first transistor 110 and the second transistor 120 can constitute a transmission gate switch having complementary characteristics. In this case, for example, the first scan signal SCAN1 provided to the first transistor 110 and the second scan signal SCAN2 provided to the second transistor 120 can be mutually inverted signals, so that it can be ensured that there is always one of the first transistor 110 and the second transistor 120 in the turn-on state, the data signal DATA can be transmitted to the storage capacitor CST without voltage loss, and the reliability and the stability of the pixel circuit can be improved.

Figure 3:
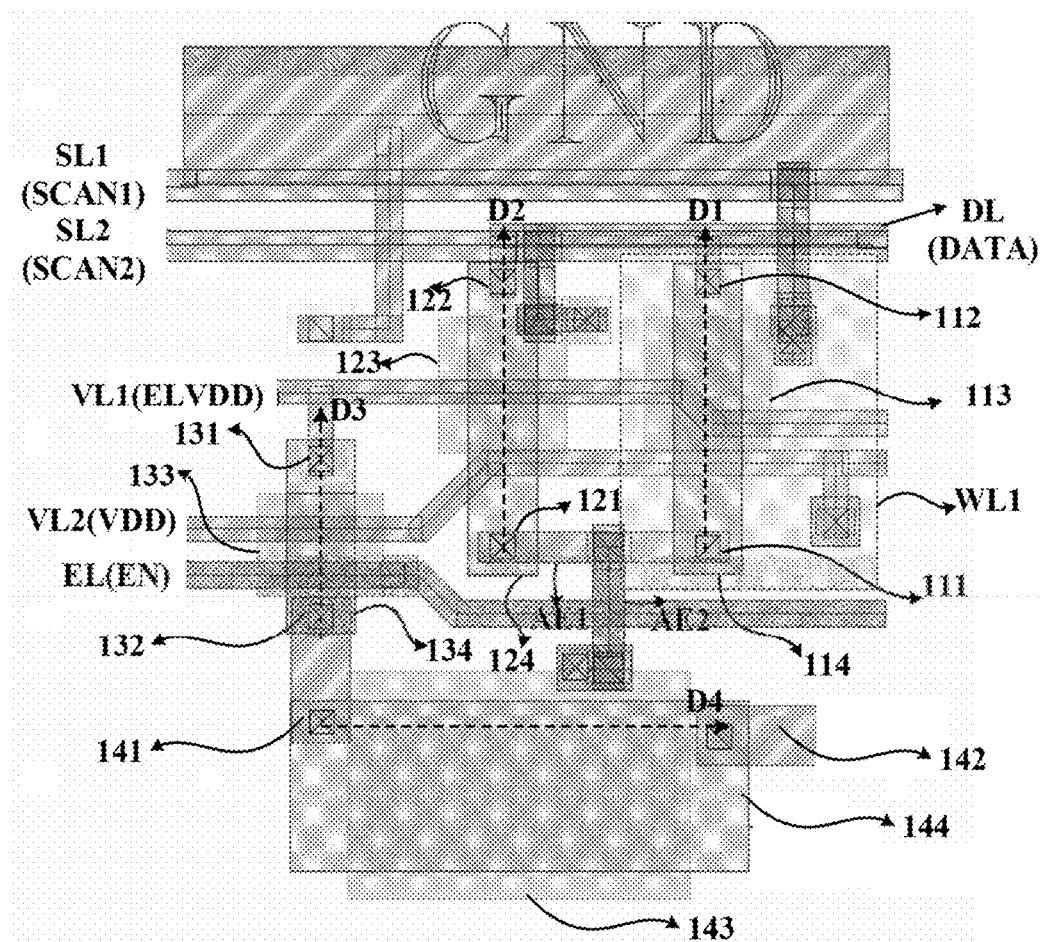
FIG. 3 is a schematic diagram of a layout corresponding to FIG. 2 provided by at least one embodiment of the present disclosure.

FIG. 3 illustrates a schematic diagram corresponding to the layout on the base substrate of the display device 100 illustrated in FIG. 2. As illustrated in FIG. 3, in the embodiments of the present disclosure, the direction from the first electrode 111 of the first transistor 110 to the second electrode 112 of the first transistor 110 is referred to as a first direction D1, the direction from the first electrode 121 of the second transistor 120 to the second electrode 122 of the second transistor 120 is referred to as a second direction D2, the direction from the first electrode 131 of the third transistor 130 to the second electrode 132 of the third transistor 130 is referred to as a third direction D3, and the direction from the first electrode 141 of the driving transistor 140 to the second electrode 142 of the driving transistor 140 is referred to as a fourth direction D4.

For example, at least one of the first direction D1 and the second direction D2 intersects with the fourth direction D4. For example, in the case where the pixel circuit includes the third transistor 130, at least one of the first direction D1, the second direction D2, and the third direction D3 intersects with the fourth direction D4. For example, the fourth direction D4 is the horizontal direction from left to right in FIG. 3.

In the pixel circuit, because the size of the driving transistor 140 is generally larger than the size of other switching transistor (for example, the first transistor 110, the second transistor 120, or the third transistor 130), the driving transistor 140 can be arranged along the fourth direction D4 when arranging the positions of the transistors, while at least one of the first direction D1, the second direction D2, and the third direction D3 intersects with the fourth direction D4, which can make the layout of the four transistors more compact, so that the layout area occupied by the display device 100 can be reduced, and the display device 100 can more easily achieve high PPI.

In some embodiments of the present disclosure, the first direction D1 and the second direction D2 can both intersect with the fourth direction D4; for another example, the first direction D1, the second direction D2, and the third direction D3 can all intersect with the fourth direction D4. For example, as illustrated in FIG. 3, the fourth direction D4 is the horizontal direction, and the first direction D1, the second direction D2, and the third direction D3 are all longitudinal directions in FIG. 3 that are perpendicular to the horizontal direction.

For example, in some embodiments of the present disclosure, the first direction D1 and the second direction D2 are both perpendicular to the fourth direction D4; for another example, the first direction D1, the second direction D2, and the third direction D3 are all perpendicular to the fourth direction D4. For the case where a plurality of pixel units in the display region of the display device are arranged in rows and columns, application of this method can make the layout of the display device 100 more compact, thereby further reducing the layout area occupied by the display device 100, and causing the display device 100 to more easily achieve high PPI.

For example, as illustrated in FIG. 3, the first transistor 110 includes a first active region 114 extending along the first direction D1, and the first active region 114 includes the first electrode 111 of the first transistor 110, the second electrode 112 of the first transistor 110, and a channel region formed between the first electrode 111 of the first transistor 110 and the second electrode 112 of the first transistor 110.

The second transistor 120 includes a second active region 124 extending along the second direction D2, and the second active region 124 includes the first electrode 121 of the second transistor 120, the second electrode 122 of the second transistor 120, and a channel region formed between the first electrode 121 of the second transistor 120 and the second electrode 122 of the second transistor 120.

The third transistor 130 includes a third active region 134 extending along the third direction D3, and the third active region 134 includes the first electrode 131 of the third transistor 130, the second electrode 132 of the third transistor 130, and a channel region formed between the first electrode 131 of the third transistor 130 and the second electrode 132 of the third transistor 130.

The driving transistor 140 includes a fourth active region 144 extending along the fourth direction D4, and the fourth active region 144 includes the first electrode 141 of the driving transistor 140, the second electrode 142 of the driving transistor 140, and a channel region formed between the first electrode 141 of the driving transistor 140 and the second electrode 142 of the driving transistor 140.

For example, the base substrate in the display device 100 provided by the embodiments of the present disclosure is a silicon-based base substrate, the above-mentioned first active region 114, second active region 124, third active region 134, and fourth active region 144 are all doped regions in the silicon-based base substrate. These doped regions are obtained by, for example, an ion implantation process or an ion diffusion process. For amorphous silicon, P-type doping may be achieved by doping boron (B), N-type doping may be achieved by doping phosphorus (P) or arsenic (As), and the embodiments of the present disclosure are not limited in this aspect.

For example, in some embodiments of the present disclosure, the doping type of the first active region 114 and the doping type of the second active region 124 are opposite to each other. For example, the doping type of the first active region 114 is P-type, and the doping type of the second active region 124 is N-type.

As illustrated in FIG. 3, two ends of the first active region 114 and two ends of the second active region 124 are aligned with each other in the fourth direction D4 respectively, and for example, two ends of the first active region 114 are arranged adjacent to and the second active region 124. In this way, the layout design of the display device 100 can be simplified.

The line connecting an edge of the first active region 114 along the first direction D1 and an edge of the second active region 124 along the second direction D2 is parallel to the fourth direction D4, and the line connecting the other edge of the first active region 114 along the first direction D1 and the other edge of the second active region 124 along the second direction D2 is parallel to the fourth direction D4. In this way, the layout design of the display device 100 can be simplified.

Compared to a silicon-based analog CMOS circuit for non-display applications, the driving current for the light-emitting element LE in the display device 100 provided by the embodiments of the present disclosure is smaller by 1 to 2 orders of magnitude. The current characteristic of the driving transistor 140 in the saturated state is:

$$I_D = \frac{1}{2}\frac{W}{L}K(V_{GS4} - V_{th})^2,$$

where $I_D$ is the driving current provided by the driving transistor 140, W/L is the width-to-length ratio of the driving transistor 140, K is a constant value, $V_{GS4}$ is the voltage difference between the gate electrode and the source electrode of the driving transistor 140, and $V_{th}$ is the threshold voltage of the driving transistor 140.

It can be seen from the above formula that to achieve a smaller driving current, for the driving transistor 140, it is necessary to increase the value of L in size design, which is however not conducive to reduce the layout area of the display device 100 adopting the driving transistor 140.

The pixel circuit 100 provided by some embodiments of the present disclosure can eliminate or avoid the above problem by adjusting the relative relationship between the doping concentrations of the first active region 114, the second active region 124, the third active region 134, and the fourth active region 144.

For example, the doping concentration of the fourth active region 144 is smaller than the doping concentration of the third active region 134. For example, the doping concentration of the third active region 134 is about $10^{17}$ cm$^{-3}$, the doping concentration of the fourth active region 144 is about $10^{13}$ cm$^{-3}$, and the doping concentration of the fourth active region 144 is 4 orders of magnitude smaller than the doping concentration of the third active region 134. The embodiments of the present disclosure can enable the driving transistor 140 to output a smaller driving current by reducing the doping concentration of the fourth active region 144 without changing the size of the driving transistor 140 (for example, the width-to-length ratio W/L remains unchanged). The driving current that is outputted changes more smoothly, so that the pixel circuit adopting the driving transistor 140 drives the light-emitting element LE (for example, an OLED) to obtain better uniformity of the gray-scale value when emitting light.

For example, in the display device 100 provided by some embodiments of the present disclosure, at least one of the doping concentration of the first active region 114 and the doping concentration of the second active region 124 is greater than the doping concentration of the third active region 134.

For example, the doping concentration of the first active region 114 and the doping concentration of the second active region 124 are both greater than the doping concentration of the third active region. For example, the doping concentration of the first active region 114 and the doping concentration of the second active region 124 are about $10^{20}$ cm$^{-3}$, in this case, the doping concentration of the first active region 114 and the doping concentration of the second active region 124 are both 3 orders of magnitude greater than the doping concentration of the third active region 134.

As illustrated in FIG. 2, the first transistor 110 and the second transistor 120 function as switching transistors in the pixel circuit, so they need to have good switching characteristics. In the case where the first active region 114 or/and the second active region 124 has a greater doping concentration, a greater driving current can be obtained and the driving current changes more quickly, thereby enabling the first transistor 110 or/and the second transistor 120 have better switching characteristics.

For example, in the embodiments of the present disclosure, the first transistor 110 is a MOS transistor with a first semiconductor type, the second transistor, the third transistor, and the driving transistor are all MOS transistors with a second semiconductor type, and the first semiconductor type is opposite to the second semiconductor type. For example, the first semiconductor type is P-type, the second semiconductor type is N-type, and the embodiments of the present disclosure include but are not limited to this case.

As illustrated in FIG. 3, the display device 100 provided by some embodiments of the present disclosure further includes a first scan signal line SL1 for transmitting the first scan signal SCAN1 and a second scan signal line SL2 for transmitting the second scan signal SCAN2, and the first scan signal line SL1 and the second scan signal line SL2 are arranged in parallel.

For example, the first scan signal line SL1 is connected to the control electrode 113 of the first transistor 110 to provide the first scan signal SCAN1, and the second scan signal line SL2 is connected to the control electrode 123 of the second transistor 120 to provide the second scan signal SCAN2.

For example, the extension direction of the first scan signal line SL1 and the extension direction of the second scan signal line SL2 are both parallel to the fourth direction D4. The orthographic projection of the first scan signal line SL1 on the base substrate is parallel to the orthographic projection of the second scan signal line SL2 on the base substrate, and for example, both parallel to the fourth direction D4.

For example, the region where the orthographic projection of the pixel circuit on the base substrate is located is the pixel region, and the first scan signal line SL1 and the second scan signal line SL2 are juxtaposed at a side of the pixel region.

As illustrated in FIG. 3, the display device 100 provided by some embodiments of the present disclosure further includes a data line DL for transmitting the data signal DATA, and the orthographic projection of the second scan signal line SL2 on the substrate at least partially overlaps with the orthographic projection of the data line DL on the base substrate. For example, the second scan signal line SL2 and the data line DL overlap with each other in a direction perpendicular to the base substrate. For example, as illustrated in FIG. 3, the plane where FIG. 3 is located can be regarded as the plane where the base substrate is located, and therefore being perpendicular to the base substrate is being perpendicular to the plane where FIG. 3 is located. The embodiment of the present disclosure can make the data line DL not occupy an extra layout area by overlapping the second scan signal line SL2 and the data line DT in the direction perpendicular to the base substrate, thereby further reducing the layout area occupied by the display device 100, and causing the display device 100 to more easily achieve high PPI.

As illustrated in FIG. 3, the display device 100 provided by some embodiments of the present disclosure further includes a first power supply voltage line VL1 for transmitting the first power supply voltage ELVDD and a light-emitting control line EL for transmitting the light-emitting control signal EN.

For example, the extension direction of a part of the first power supply voltage line VL1 and the extension direction of a part of the light-emitting control line EL are parallel to the fourth direction D4, and the orthographic projection of the first scan signal line SL1 on the base substrate, the orthographic projection of the second scan signal line SL2 on the base substrate, the orthographic projection of the first power supply voltage line VL1 on the base substrate, and the orthographic projection of the light-emitting control line EL on the base substrate are sequentially arranged in the direction perpendicular to the fourth direction.

It should be noted that, in the display device 100 provided by some embodiments of the present disclosure, as illustrated in FIG. 3, the orthographic projection of the first power supply voltage line VL1 on the base substrate is between the orthographic projection of the second scan signal line SL2 on the base substrate and the orthographic projection of the light-emitting control line EL on the base substrate, because the first power supply voltage ELVDD transmitted by the first power supply voltage line VL1 is a DC signal, and the second scan signal SCAN2 transmitted by the second scan signal line SL2 and the light-emitting control signal EN transmitted by the light-emitting control line EL are both jump signals, the above arrangement can effectively shield the mutual interference between the second scan signal SCAN2 and the light-emitting control signal EN.

As illustrated in FIG. 3, the display device 100 provided by some embodiments of the present disclosure further includes a second power supply voltage line VL2 for transmitting the second power supply voltage VDD, and the third electrode of the first transistor 110 is electrically connected to the second power supply voltage line VL2 to receive the second power supply voltage VDD. For example, the second power supply voltage VDD in the embodiments of the present disclosure is a high-level voltage, for example, the second power supply voltage is at 5V.

For example, the first transistor 110 is a P-type MOS transistor, and the channel region of the first transistor is P-type doped. As illustrated in FIG. 2, the third electrode, which is opposite to the control electrode (gate electrode) 113, of the first transistor 110 receives the second power supply voltage VDD. For example, the second transistor 120, the third transistor 130, and the driving transistor 140 are all N-type MOS transistors, the channel regions of the second transistor 120, the third transistor 130 and the driving transistor 140 are N-type doped, and the third electrode of the second transistor 120, the third electrode of the third transistor 130, and the third electrode of the driving transistor 140 are all configured to be grounded (GND).

For example, the orthographic projection of the second power supply voltage line VL2 on the base substrate is between the orthographic projection of the first power supply voltage line VL1 on the base substrate and the orthographic projection of the light-emitting control line EL on the base substrate, and the extension direction of a part of the second power supply voltage line VL2 is parallel to the fourth direction D4.

As illustrated in FIG. 3, the second power supply voltage line VL2 has a bending region when extending in the fourth direction D4; in addition, the light-emitting control line EL also has a bending region when extending in the fourth direction D4, and the second power supply voltage line VL2 and the light-emitting control line EL have different bending directions. Adopting this wiring method can, for example, leave a layout space for a first transfer electrode AE1 described below.

For example, as illustrated in FIG. 3, the first transistor 110 and the second transistor 120 are both between the second scan signal line SL2 and the light-emitting control line EL, and the first transistor 110 intersects with the first power supply voltage line VL1 and the second power supply voltage line VL2, and the second transistor 120 intersects with the first power supply voltage line VL1 and the second power supply voltage line VL2.

For example, the orthographic projection of the first active region 114 of the first transistor 110 on the base substrate and the orthographic projection of the second active region 124 of the second transistor 120 on the base substrate are both between the orthographic projection of the second scan signal line SL2 on the base substrate and the orthographic projection of the light-emitting control line EL on the base substrate.

The orthographic projection of the first active region 114 of the first transistor 110 on the base substrate intersects with the orthographic projection of the first power supply voltage line VL1 on the base substrate, and the orthographic projection of the first active region 114 of the first transistor 110 on the base substrate intersects with the orthographic projection of the second power supply voltage line VL2 on the base substrate.

The orthographic projection of the second active region 124 of the second transistor 120 on the base substrate intersects with the orthographic projection of the first power supply voltage line VL1 on the base substrate, and the orthographic projection of the second active region 124 of the second transistor 120 on the base substrate intersects with the orthographic projection of the second power supply voltage line VL2 on the base substrate.

As illustrated in FIG. 3, the display device 100 provided by some embodiments of the present disclosure further includes the first transfer electrode AE1 provided at a first side of the light-emitting control line EL, and a second transfer electrode AE2 extending from the first side of the light-emitting control line EL to a second side of the light-emitting control line EL.

For example, the orthographic projection of the second transfer electrode AE2 on the base substrate crosses the orthographic projection of the light-emitting control line EL on the base substrate. Two ends of the first transfer electrode AE1 are respectively electrically connected to the first electrode 111 of the first transistor 110 and the first electrode 121 of the second transistor 120, the first transfer electrode AE1 is electrically connected to the second transfer electrode AE2, and the second transfer electrode AE2 is electrically connected to the control electrode 143 of the driving transistor 140.

For example, the extension direction of the second transfer electrode AE2 is perpendicular to the extension direction of the first transfer electrode AE1 and is perpendicular to the fourth direction D4.

Because the second transfer electrode AE2 is connected to the storage capacitor CST, the electrical level of the second transfer electrode AE2 may fluctuate greatly during operation of the pixel circuit, and the fluctuation may cause crosstalk to the first power supply voltage line VL1, and cause noises. In the display device 100 provided by the embodiments of the present disclosure, the first power supply voltage line VL1 and the second transfer electrode AE2 are spaced apart by the second power supply voltage line VL2, so that the crosstalk caused by the electrical level fluctuation on the second transfer electrode AE2 on the first power supply voltage line VL1 can be reduced, and noises can be isolated.

In addition, the display device 100 provided by some embodiments of the present disclosure extends the first active region 114 of the first transistor 110 and the second active region 124 of the second transistor 120 to leave a wiring channel for the second power supply voltage line VL2.

For example, the layout size of the pixel circuit (rectangular shape) provided by the embodiments of the present disclosure is approximately 4.5 μm×2.9 μm.

FIG. 4A-FIG. 4E respectively illustrate plan diagrams of the layout of five layers of the display device illustrated in FIG. 3.

Figure 4A:
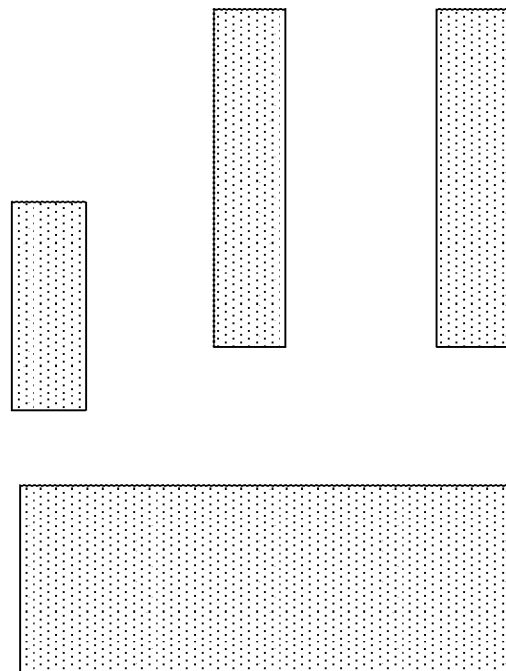
FIG. 4A-FIG. 4E respectively illustrate plan diagrams of the layout of five layers of the display device illustrated in FIG. 3.

FIG. 4A illustrates the first active region 114 of the first transistor 110, the second active region 124 of the second transistor 120, the third active region 134 of the third transistor 130, and the fourth active region 144 of the driving transistor 140, and the layer illustrated in FIG. 4A may be referred to as an effective display layer (AA).

Figure 4B:
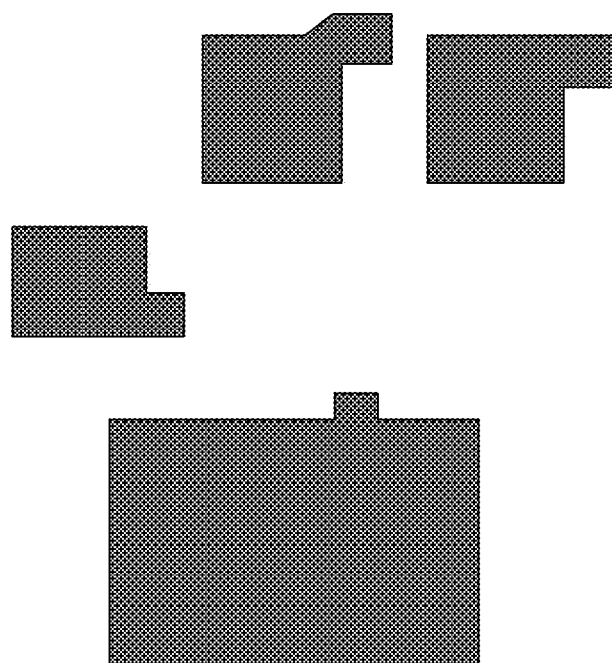

FIG. 4B illustrates the control electrode 113 of the first transistor 110, the control electrode 123 of the second transistor 120, the control electrode 133 of the third transistor 130, and the control electrode 143 of the driving transistor 140. The layer illustrated in FIG. 4B may be referred to as a first conductive layer, and the first conductive layer will be described further below. For example, the material of the first conductive layer may be polysilicon.

Figure 4C:
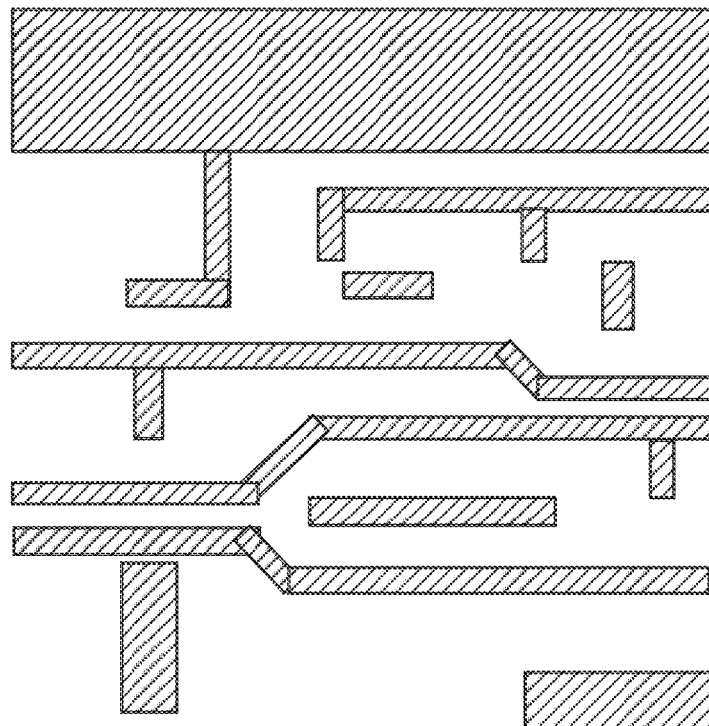

FIG. 4C illustrates the first power supply voltage line VL1, the second power supply voltage line VL2, the light-emitting control line EL, the data line DL, the ground line GND, the first transfer electrode AE1, and the like. The layer illustrated in FIG. 4C may be referred to as a first metal layer (metal1).

Figure 4D:

FIG. 4D illustrates the second transfer electrode AE2, the electrode connecting the first scan signal line SL1 and the first transistor 110, and the electrode connecting the second scan signal line SL2 and the second transistor 120. The layer illustrated in FIG. 4D may be referred to as a second metal layer (metal2).

Figure 4E:
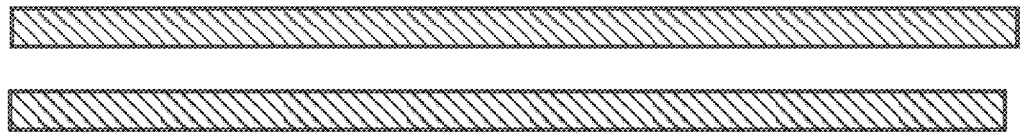

FIG. 4E illustrates the first scan signal line SL1 and the second scan signal line SL2, and the layer illustrated in FIG. 4E may be referred to as a third metal layer (metal3).

It should be noted that, in the embodiments of the present disclosure, for the sake of clarity, the storage capacitor CST is not illustrated in FIG. 3, and the storage capacitor CST illustrated in FIG. 2 is further described below in conjunction with FIG. 5-FIG. 7E.

Figure 5:
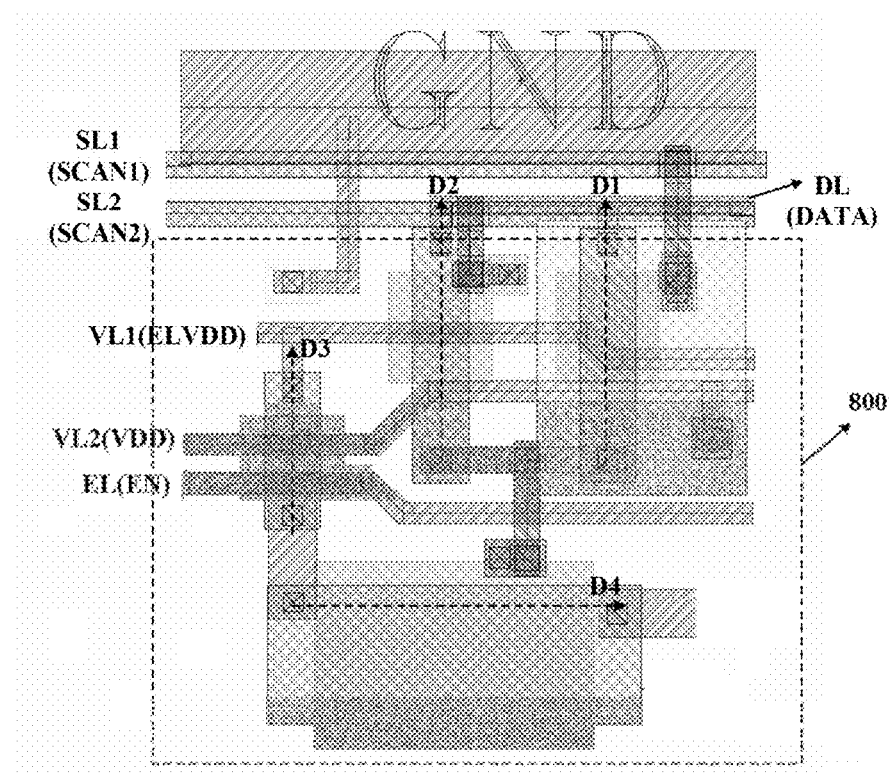
FIG. 5 is a schematic diagram illustrating the region where a storage capacitor is located, provided by at least one embodiment of the present disclosure.

As illustrated in FIG. 5, the region 800 illustrated in FIG. 5 is a region where the storage capacitor CST is provided. It should be noted that, for the sake of clarity, the corresponding marks of all structures are not illustrated in FIG. 5, and for the omitted parts, refer to the corresponding marks in FIG. 3.

Figure 6:
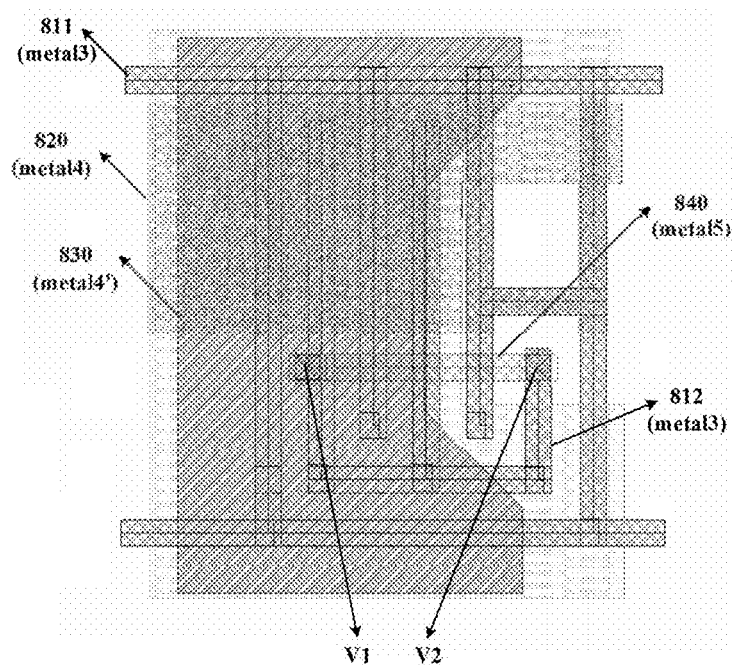
FIG. 6 is a schematic diagram of a layout of a storage capacitor provided by at least one embodiment of the present disclosure.
Figure 7A:
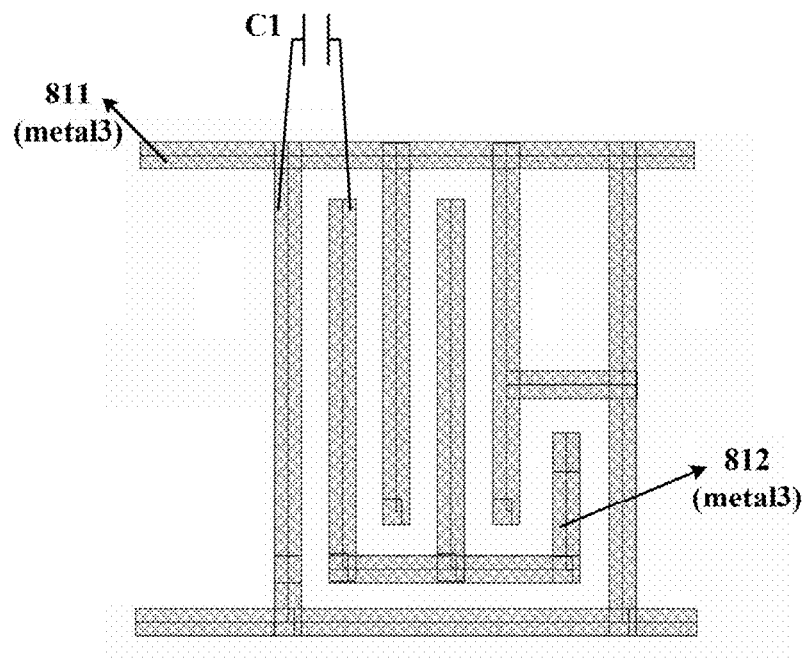
FIG. 7A-FIG. 7D respectively illustrate plan diagrams of the layout of the four layers illustrated in FIG. 6.
Figure 7B:
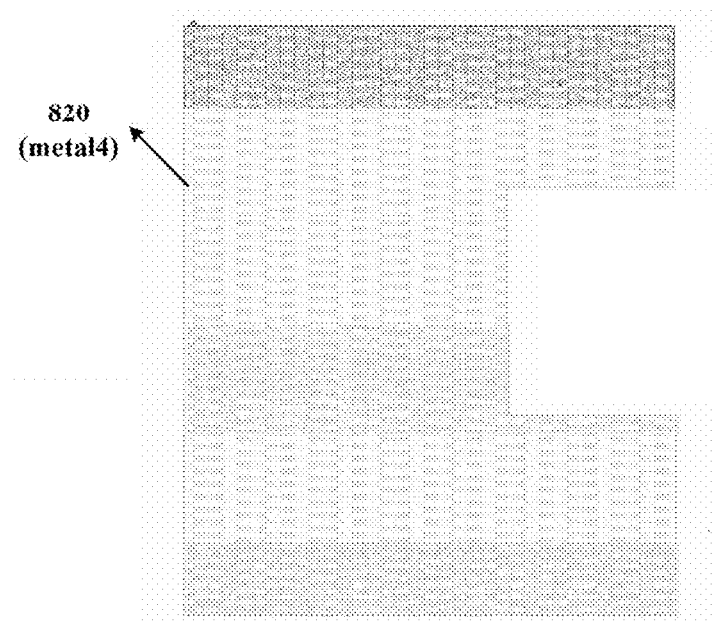
Figure 7C:
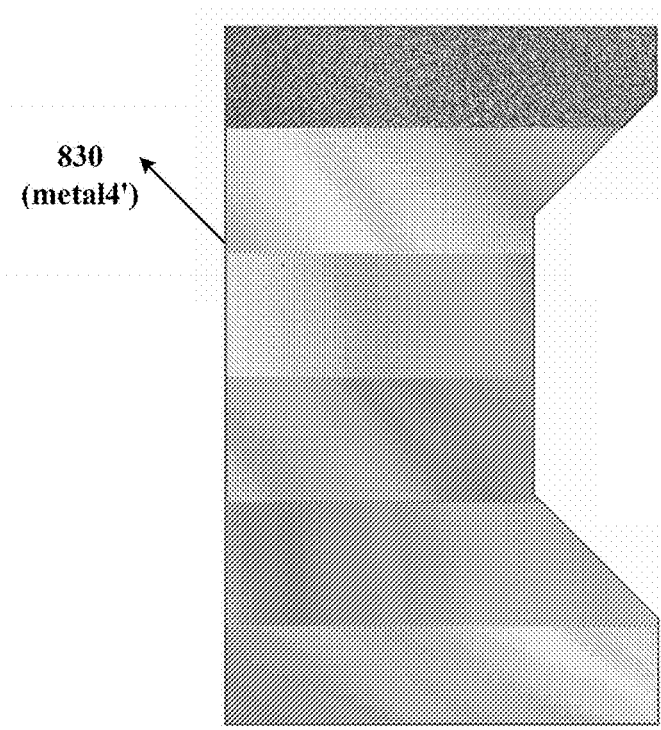
Figure 7D:
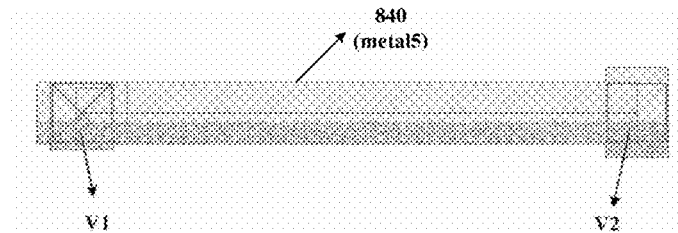
Figure 7E:
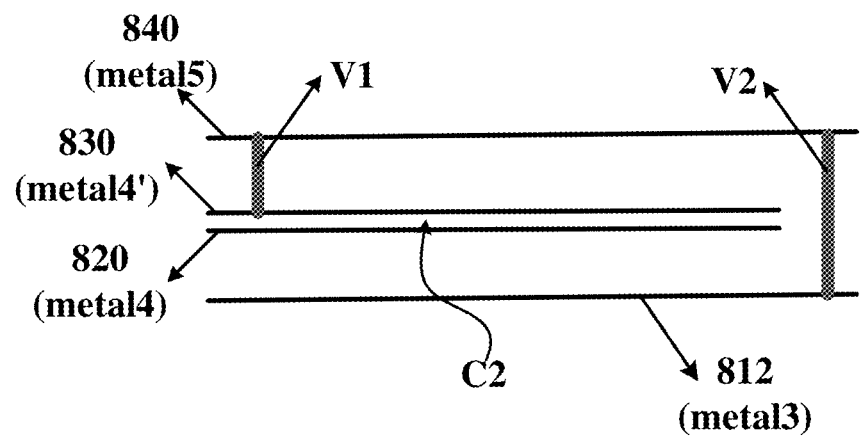
FIG. 7E is a schematic cross-sectional diagram of a storage capacitor provided by at least one embodiment of the present disclosure.

FIG. 6 is a layout diagram of the storage capacitor CST, FIG. 7A-FIG.7D are plan diagrams corresponding to the layout of each layer of FIG. 6, and FIG. 7E is a schematic cross-sectional diagram of the storage capacitor CST.

FIG. 6 illustrates a structure of four layers, which is the third metal layer metal3, a fourth metal layer metal4, an auxiliary metal layer metal4', and a fifth metal layer metal5. In addition, a first via hole V1 and a second via hole V2 are illustrated; the first via hole V1 and the second via hole V2 will be described below in conjunction with the schematic cross-sectional diagram, and the description thereto are not repeated here for simplicity.

For example, FIG. 7A illustrates the third metal layer metal3, for example, the third metal layer and the layer illustrated in FIG. 4E are the same layer. As illustrated in FIG. 7A, the third metal layer metal3 includes two parts, an electrode 811 serving as the first electrode of the first capacitor C1 and an electrode 812 serving as the second electrode of the first capacitor C1. For example, the electrode 811 is configured to receive the third power supply voltage AVSS; and the electrode 812 is electrically connected to the electrode 840 in the fifth metal layer metal5 through the second via hole V2, thereby achieving electrical connection with the control electrode 143 of the driving transistor 140.

The electrode 811 includes a plurality of strip electrodes, the electrode 812 includes a plurality of strip electrodes, the plurality of strip electrodes of the electrode 811 and the plurality of strip electrodes of the electrode 812 are alternately arranged with each other, and the space portion between the electrode 811 and the electrode 812 forms the first capacitor C1. For example, the first capacitor C1 is a part of the storage capacitor CST. For example, the first capacitor C1 and the second capacitor C2 hereinafter are connected in parallel to form the storage capacitor CST.

For example, FIG. 7B illustrates an electrode 820 located in the fourth metal layer metal4. For example, the electrode 820 is a planar electrode, and the electrode 820 serves as the first electrode of the second capacitor C2.

For example, FIG. 7C illustrates an electrode 830 located in the auxiliary metal layer metal4'. For example, the electrode 830 is a planar electrode, and the electrode 830 serves as the second electrode of the second capacitor C2.

For example, FIG. 7D illustrates an electrode 840 located in the fifth metal layer metal5, and the first via hole V1 and the second via hole V2.

FIG. 7E illustrates a schematic cross-sectional diagram of a part of the structure of the storage capacitor CST. As illustrated in FIG. 7E, the electrode 840 in the fifth metal layer metal5 is electrically connected to the electrode 830 in the auxiliary metal layer metal4' through the first via hole V1. In addition, the electrode 840 located in the fifth metal layer metal5 is electrically connected to the electrode 812 located in the third metal layer metal3 through the second via hole V2. It should be noted that, the second via hole V2 penetrates the fourth metal layer metal4, which is not illustrated in FIG. 7E.

As illustrated in FIG. 7E, the electrode 820 in the fourth metal layer metal4, the electrode 830 in the auxiliary metal layer metal4', and the space portion between the electrode 820 and the electrode 830 form the second capacitor C2. For example, the first capacitor C1 described above and the second capacitor C2 are connected in parallel to form the storage capacitor CST.

In the embodiment of the present disclosure, as illustrated in FIG. 7E, the auxiliary metal layer metal4' is provided between the fourth metal layer metal4 and the fifth metal layer metal5, so that the distance between the fourth metal layer metal4 and the auxiliary metal layer metal4' is, for example, about 1/10 of the distance between the fourth metal layer metal4 and the fifth metal layer metal5, and the capacitance value per unit area of the second capacitor C2 can be effectively increased.

As illustrated in FIG. 2 and FIG. 3, the embodiment of the present disclosure further provides a display device 100 including a base substrate and at least one pixel circuit provided on the base substrate. The pixel circuit includes a driving transistor 140, a first transistor 110, a second transistor 120, and a third transistor 130.

The driving transistor 140 includes a control electrode 143, a first electrode 141 and a second electrode 142, and is configured to control a driving current, flowing through the first electrode 141 of the driving transistor 140 and the second electrode 142 of the driving transistor 140, for driving a light-emitting element to emit light according to a voltage of the control electrode 143 of the driving transistor 140.

The first transistor 110 is connected to the control electrode 143 of the driving transistor 140 and is configured to write a data signal DATA to the control electrode 143 of the driving transistor 140 in response to a first scan signal SCAN1. The second transistor 120 is connected to the control electrode 143 of the driving transistor 140 and is configured to write the data signal DATA to the control electrode 143 of the driving transistor 140 in response to a second scan signal SCAN2. The third transistor 130 is connected to the first electrode 141 of the driving transistor 140 and is configured to apply a first power supply voltage ELVDD to the first electrode 141 of the driving transistor 140 in response to a light-emitting control signal EN.

The display device 100 further includes a first scan signal line SL1 for transmitting the first scan signal SCAN1 and a second scan signal line SL2 for transmitting the second scan signal SCAN2, and a first power supply voltage line VL1 for transmitting the first power supply voltage ELVDD, and a light-emitting control line EL for transmitting the light-emitting control signal EN. The orthographic projection of the first scan signal line SL1 on the base substrate, the orthographic projection of the second scan signal line SL2 on the base substrate, the orthographic projection of the first power supply voltage line VL1 on the base substrate, and the orthographic projection of the light-emitting control line EL on the base substrate are sequentially arranged in a direction perpendicular to a fourth direction D4.

For example, a direction from the first electrode 111 of the first transistor 110 to the second electrode 112 of the first transistor 110 is a first direction D1, a direction from a first electrode 121 of the second transistor 120 to a second electrode 122 of the second transistor 120 is a second direction D2, a direction from a first electrode 131 of the third transistor 130 to a second electrode 132 of the third transistor 130 is a third direction D3, and a direction from the first electrode 141 of the driving transistor 140 to the second electrode 142 of the driving transistor 140 is the fourth direction D4. The first direction D1, the second direction D2, and the third direction D3 all intersect with the fourth direction D4, for example, the first direction D1, the second direction D2, and the third direction D3 all perpendicular to the fourth direction D4.

At least one embodiment of the present disclosure further provides a manufacturing method of the display device 100, and the manufacturing method includes forming a pixel circuit on a base substrate.

The pixel circuit includes a driving transistor 140, a first transistor 110, and a second transistor 120.

The driving transistor 140 includes a control electrode 143, a first electrode 141 and a second electrode 142, and is configured to control a driving current, flowing through the first electrode 141 of the driving transistor 140 and the second electrode 142 of the driving transistor 140, for driving a light-emitting element to emit light according to a voltage of the control electrode 143 of the driving transistor 140.

The first transistor 110 is connected to the control electrode 143 of the driving transistor 140 and is configured to write a data signal DATA to the control electrode 143 of the driving transistor 140 in response to a first scan signal SCAN1. The second transistor 120 is connected to the control electrode 143 of the driving transistor 140 and is configured to write the data signal DATA to the control electrode 143 of the driving transistor 140 in response to a second scan signal SCAN2.

The direction from the first electrode 111 of the first transistor 110 to the second electrode 112 of the first transistor 110 is a first direction D1, the direction from a first electrode 121 of the second transistor 120 to a second electrode 122 of the second transistor 120 is a second direction D2, and the direction from the first electrode 141 of the driving transistor 140 to the second electrode 142 of the driving transistor 140 is the fourth direction D4. At least one of the first direction D1 and the second direction D2 intersects with the fourth direction D4, for example, the first direction D1 and the second direction D2 are both perpendicular to the fourth direction D4.

At present, as users' demands for high-brightness display of silicon-based OLED display devices continue to increase, the pixel circuit in the display device needs to output a higher driving current to the anode of the OLED. For example, as illustrated in FIG. 2, when the OLED needs to output a larger brightness, the anode voltage of the OLED needs a higher voltage $V_{anode}$, and at this time, the first electrode 111 (for example, the drain electrode) of the first transistor 110 and the first electrode 121 (for example, the drain electrode) of the second transistor 120 may bear a high voltage $V_{anode}+V_{GS4}$ ($V_{GS4}$ is the voltage difference between the gate electrode and the second electrode of the driving transistor 140), and a high voltage may appear between the gate electrode and the first electrode of the first transistor 110, and a high voltage may appear between the gate electrode and the first electrode of the first transistor 120. In this case, the first transistor 110 and the second transistor 120 in the pixel circuit may bear the high voltage, and a breakdown phenomenon may occur, which may affect the reliability and stability of the pixel circuit.

At least one embodiment of the present disclosure further provides a structural design of a transistor that can reduce or avoid the risk of breakdown by a high voltage, so that the pixel circuit adopting the transistor cannot be easily broken by a high voltage and the high-brightness display driving of the pixel circuit can be implemented.

At least one embodiment of the present disclosure provides a display device 100 including a base substrate and a pixel circuit provided on the base substrate. The pixel circuit includes a driving transistor 140, a first transistor 110, and a second transistor 120. The driving transistor 140 includes a control electrode 143, a first electrode 141, and a second electrode 142, and the driving transistor 140 is configured to control a driving current, flowing through the first electrode 141 of the driving transistor 140 and the second electrode 142 of the driving transistor 140, for driving a light-emitting element LE to emit light according to the voltage of the control electrode 143 of the driving transistor 140. A first electrode 111 of the first transistor 110 is connected to the control electrode143 of the driving transistor 140, and is configured to write a data signal DATA to the control electrode 143 of the driving transistor 140 in response to a first scan signal SCAN1. The second transistor 120 is connected to the control electrode 143 of the driving transistor 140, and is configured to write the data signal DATA to the control electrode 143 of the driving transistor 140 in response to a second scan signal SCAN2.

Figure 8:
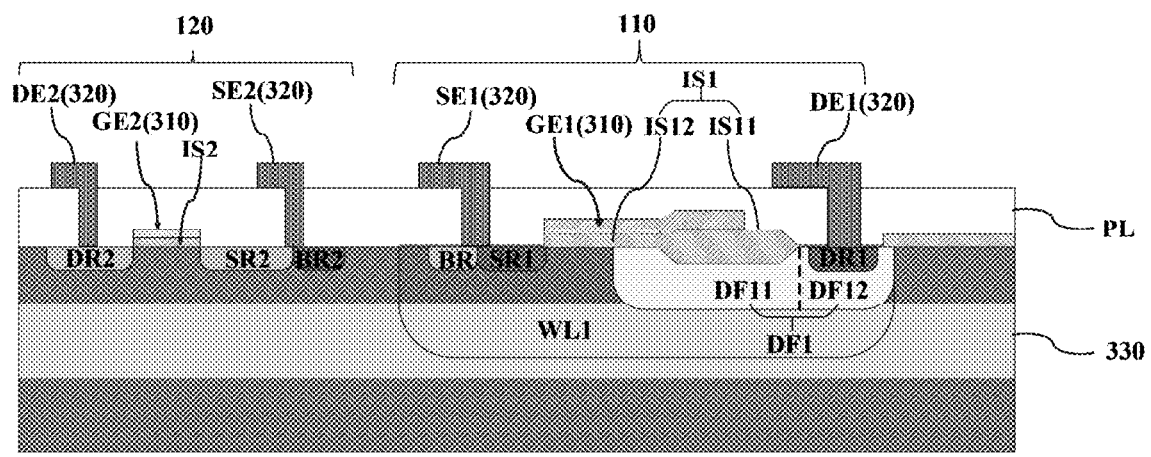
FIG. 8 is a schematic cross-sectional diagram of a first transistor and a second transistor provided by at least one embodiment of the present disclosure.

For example, as illustrated in FIG. 8, the base substrate includes a semiconductor body 330 that can be doped, and includes a first conductive layer 310 and a second conductive layer 320 that are on the semiconductor body 330.

The first transistor 110 includes a gate electrode GE1 in the first conductive layer 310, a second electrode SE1 and a first electrode DE1 which are both in the second conductive layer 320, a first doped region DR1 in contact with the first electrode DE1 of the first transistor 110, and a second doped region SR1 in contact with the second electrode SE1 of the first transistor 110; and the first doped region DR1 of the first transistor 110 and the second doped region SR1 of the first transistor 110 are spaced apart from each other, have the same doping type, and are both in the semiconductor body 330. A channel region of the first transistor 110 is between the first doped region DR1 and the second doped region SR1. When the first transistor 110 is turned on due to the control voltage applied to the gate electrode GE1, the first doped region DR1 and the second doped region SR1 are electrically connected through the channel region. It should be noted that, the gate electrode GE1 of the first transistor 110 here is the control electrode 113 of the first transistor 110 described above, and the following embodiments are the same and will not be repeated herein.

As illustrated in FIG. 8, the first transistor 110 further includes a drift doped region DF1 in contact with the first doped region DR1; and the drift doped region DF1 of the first transistor 110 and the second doped region SR1 of the first transistor 110 are spaced apart from each other, have the same doping type, and are both in the semiconductor body 330. For example, the first transistor 110 is a P-type MOS transistor. The doping types of the first doped region DR1, the second doped region SR1 and the drift doped region DF1 of the first transistor 110 are all P-type doping, and the semiconductor body 330 is a bulk silicon with a doping type of P-type or a silicon-on-insulator with a doping type of P-type.

For example, the orthographic projection of the gate electrode GE1 of the first transistor 110 on the base substrate partially overlaps with the orthographic projection of the drift doped region DF1 of the first transistor 110 on the base substrate, and the orthographic projection of the first doped region DR1 of the first transistor 110 on the base substrate is in the orthographic projection of the drift doped region DF1 of the first transistor 110 on the base substrate. The doping concentration of the drift doped region DF1 of the first transistor 110 is smaller than the doping concentration of the first doped region DR1 of the first transistor 110. When the first transistor 110 is turned on due to the control voltage applied to the gate electrode GE1, the first doped region DR1 and the second doped region SR1 are electrically connected through the channel region and the drift doped region DF1 of the first transistor 110.

The pixel circuit in the display device 100 provided by the embodiment of the present disclosure provides the drift doped region DF1 in the first transistor 110 and makes the doping concentration of the drift doped region DF1 of the first transistor 110 smaller than the doping concentration of the first doped region DR1 of the first transistor 110, which can increase the breakdown voltage between the first electrode DE1 and the second electrode SE1 of the first transistor 110, so that the risk of breakdown of the first transistor 110 by a high voltage can be reduced or avoided. For example, the first transistor 110 is a P-type MOS transistor.

As illustrated in FIG. 8, in at least one embodiment, the drift doped region DF1 of the first transistor 110 includes a first portion DF11 and a second portion DF12. The orthographic projection of the second portion DF12 on the base substrate overlaps with the orthographic projection of the first doped region DR1 of the first transistor 110 on the base substrate, in this case, it can be considered that the second portion DF12 of the drift doped region DF1 of the first transistor 110 constitutes a part of the channel region and is different from other parts of the channel region. For example, the first doped region DR1 of the first transistor 110 is in the drift doped region DF1 of the first transistor 110. For example, the doping depth of the first doped region DR1 of the first transistor 110 in the semiconductor body 330 may be smaller than, equal to, or greater than the doping depth of the drift doped region DF1 of the first transistor 110.

As illustrated in FIG. 8, in the first transistor 110 provided by some embodiments of the present disclosure, the first doped region DR1, the second doped region SRL and the drift doped region DF1 of the first transistor 110 are in a first well WL1 in the semiconductor body 330, for example, the doping type of the first well WL1 is N-type doping.

The orthographic projection of the gate electrode GE1 of the first transistor 110 on the base substrate is in the orthographic projection of the first well WL1 on the base substrate, and a portion, which is between the first doped region DR1 of the first transistor 110 and the second doped region SR1 of the first transistor 110, of the first well WL1 constitutes the channel region of the first transistor 110. For example, FIG. 3 illustrates the region where the first well WL1 is located.

For example, as illustrated in FIG. 8, the first transistor 110 further includes an auxiliary doped region BR, for example, the doping type of the auxiliary doped region BR of the first transistor 110 is N-type doping. The auxiliary doped region BR of the first transistor 110 is in contact with the second doped region SR1 of the first transistor 110, the auxiliary doped region BR of the first transistor 110 is electrically connected to the second electrode SE1 of the first transistor 110, and the orthographic projection of the auxiliary doped region BR of the first transistor 110 on the base substrate is in the orthographic projection of the first well WL1 on the base substrate. The auxiliary doped region BR can play an isolation role to prevent leakage.

As illustrated in FIG. 8, the base substrate in the display device 100 provided by some embodiments of the present disclosure further includes a first insulating layer IS1 between the semiconductor body 330 and the first conductive layer 310, and the first insulating layer IS1 can enable the gate electrode GE1 of the first transistor 110 to be insulated from the semiconductor body 330. For example, the first insulating layer IS1 may be a gate insulating layer, such as a silicon oxide layer, and may be formed by a vapor deposition process, or obtained by directly oxidizing a silicon-based base substrate through a thermal oxidation process.

The first insulating layer IS1 includes a first portion IS11 close to the first doped region DR1 of the first transistor 110 and a second portion IS12 away from the first doped region DR1 of the first transistor 110.

For example, in at least one embodiment, the thickness of the first portion IS11 of the first insulating layer IS1 is greater than the thickness of the second portion IS12 of the first insulating layer IS1, and the thicknesses include the thickness in a direction perpendicular to the base substrate. For example, the thickness of the first portion IS11 of the first insulating layer IS1 is 7-8 nm, and the thickness of the second portion IS12 of the first insulating layer IS1 is 2-3 nm.

In the embodiment of the present disclosure, by increasing the thickness of the first portion IS11 of the first insulating layer IS1, for example, to more than twice the thickness of the second portion IS12, the risk of breakdown by a high voltage between the gate electrode GE1 of the first transistor 110 and the first electrode DE1 of the first transistor 110 can be reduced or avoided.

As illustrated in FIG. 8, the base substrate further includes a planarization insulating layer PL that covers the gate electrode GE1 of the first transistor 110, and the light-emitting element LE is above the planarization insulating layer PL. The planarization insulating layer PL can cover the above-mentioned pixel circuit, so that the surface of the planarization insulating layer PL is relatively flat, which is more advantageous for forming the light-emitting element LE on the planarization insulating layer PL. The planarization insulating layer PL may be silicon oxide, silicon oxynitride, silicon nitride, etc., and may be obtained by processes such as vapor deposition.

For example, in the embodiment illustrated in FIG. 8, the first transistor 110 adopts a structural design that can reduce or avoid the risk of breakdown by a high voltage, and the second transistor 120 adopts a structural design of a general MOS transistor. As illustrated in FIG. 8, the second transistor 120 includes a gate electrode GE2 in the first conductive layer 310, a first electrode DE2 and a second electrode SE2 that are both in the second conductive layer 320, a first doped region DR2 in contact with the first electrode DE2 of the second transistor 120, and a second doped region SR2 in contact with the second electrode SE2 of the second transistor 120. The first doped region DR2 of the second transistor 120 and the second doped region SR2 of the second transistor 120 are spaced apart from each other, have the same doping type, and are both in the semiconductor body 330. It should be noted that, the gate electrode GE2 of the second transistor 120 here is the control electrode 123 of the second transistor 120 described above, and the following embodiments are the same and will not be repeated herein. For example, the second transistor 120 is an N-type MOS transistor, and the doping types of the first doped region DR2 and the second doped region SR2 of the second transistor 120 are both N-type doping.

For example, as illustrated in FIG. 8, the second transistor 120 further includes an auxiliary doped region BR2, the auxiliary doped region BR2 of the second transistor 120 is in contact with the second doped region SR2 of the second transistor 120, and the auxiliary doped region BR2 of the second transistor 120 is electrically connected to the second electrode SE2 of the second transistor 120. The doping type of the auxiliary doped region BR2 of the second transistor 120 is opposite to the doping type of the second doped region SR2 of the second transistor 120, for example, the doping type of the auxiliary doping region BR2 of the second transistor 120 is P-type doping. The auxiliary doped region BR2 can play an isolation role to prevent electrical leakage.

It should be noted that, the embodiments of the present disclosure include but are not limited to the above-mentioned situation. The first transistor 110 may also be an N-type MOS transistor, the doping type of the first doped region DR1 in the first transistor 110 is N-type, and the semiconductor body 330 is a bulk silicon with a doping type of P-type or a silicon-on-insulator with a doping type of P-type.

For example, in the case where the first transistor 110 is an N-type MOS transistor, the first transistor 110 may further include an auxiliary doped region, in this case, the doping type of the auxiliary doped region of the first transistor 110 is P-type. The auxiliary doped region of the first transistor 110 is in contact with the second doped region SR1 of the first transistor 110, and the auxiliary doped region is electrically connected to the second electrode SE1 of the first transistor 110.

Figure 9:
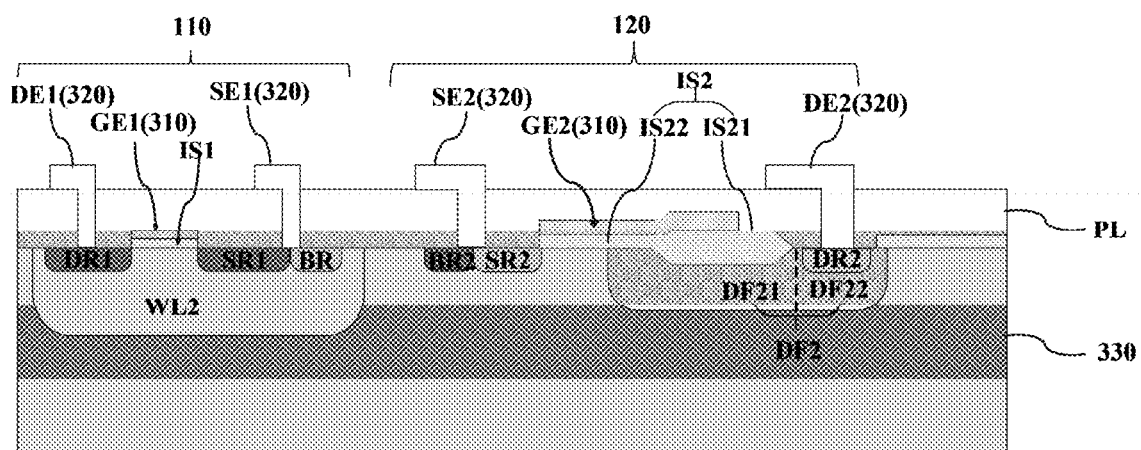
FIG. 9 is another schematic cross-sectional diagram of a first transistor and a second transistor provided by at least one embodiment of the present disclosure.

As illustrated in FIG. 9, in the pixel circuit provided by some embodiments of the present disclosure, the second transistor 120 adopts a structural design that can reduce or avoid the risk of breakdown by a high voltage, and the first transistor 110 adopts a structural design of a general MOS transistor.

As illustrated in FIG. 9, the second transistor 120 includes a gate electrode GE2 in the first conductive layer 310, a first electrode DE2 and a second electrode SE2 that are both in the second conductive layer 320, a first doped region DR2 in contact with the first electrode DE2 of the second transistor 120, and a second doped region SR2 in contact with the second electrode SE2 of the second transistor 120. The first doped region DR2 of the second transistor 120 and the second doped region SR2 of the second transistor 120 are spaced apart from each other, have the same doping type, and are both in the semiconductor body 330.

For example, the second transistor 120 further includes a drift doped region DF2 in contact with the first doped region DR2; and the drift doped region DF2 of the second transistor 120 and the second doped region SR2 of the second transistor 120 are spaced apart from each other, have the same doping type, and are both in the semiconductor body 330.

For example, the second transistor 120 is a P-type MOS transistor. The doping types of the first doped region DR2, the second doped region SR2, and the drift doped region DF2 of the second transistor 120 are all N-type doping, and the semiconductor body 330 is a bulk silicon with a doping type of P-type or a silicon-on-insulator with a doping type of P-type.

For example, the orthographic projection of the gate electrode GE2 of the second transistor 120 on the base substrate partially overlaps with the orthographic projection of the drift doped region DF2 of the second transistor 120 on the base substrate, and the orthographic projection of the first doped region DR2 of the second transistor 120 on the base substrate is in the orthographic projection of the drift doped region DF2 of the second transistor 120 on the base substrate. The doping concentration of the drift doped region DF2 of the second transistor 120 is smaller than the doping concentration of the first doped region DR2 of the second transistor 120.

The pixel circuit in the display device 100 provided by the embodiments of the present disclosure provides the drift doped region DF2 in the second transistor 120 and makes the doping concentration of the drift doped region DF2 of the second transistor 120 smaller than the doping concentration of the first doped region DR2 of the second transistor 120, which can increase the breakdown voltage between the first electrode DE2 and the second electrode SE2 of the second transistor 120, so that the risk of breakdown of the second transistor 120 by a high voltage can be reduced or avoided. As illustrated in FIG. 9, the drift doped region DF2 of the second transistor 120 includes a first portion DF21 and a second portion DF22, and the orthographic projection of the second portion DF22 on the base substrate overlaps with the orthographic projections of the first doped region DR2 of the second transistor 120 on the base substrate. For example, the first doped region DR2 of the second transistor 120 is in the drift doped region DF2 of the second transistor 120.

For example, as illustrated in FIG. 9, the second transistor 120 further includes an auxiliary doped region BR2, and for example, the doping type of the auxiliary doping region BR2 of the second transistor 120 is P-type doping. The auxiliary doped region BR2 of the second transistor 120 is in contact with the second doped region SR2 of the second transistor 120, and the auxiliary doped region BR2 of the second transistor 120 is electrically connected to the second electrode SE2 of the second transistor 120. The auxiliary doped region BR2 can play an isolation role to prevent leakage.

As illustrated in FIG. 9, the base substrate in the display device 100 provided by some embodiments of the present disclosure further includes a second insulating layer IS2 between the semiconductor body 330 and the first conductive layer 310, and the second insulating layer IS1 can enable the gate electrode GE2 of the second transistor 120 to be insulated from the semiconductor body 330. For example, the second insulating layer IS2 may be a gate insulating layer, such as a silicon oxide layer, and may be formed by a vapor deposition process, or obtained by directly oxidizing a silicon-based base substrate through a thermal oxidation process.

The second insulating layer IS2 includes a first portion IS21 close to the first doped region DR2 of the second transistor 120 and a second portion IS22 away from the first doped region DR2 of the second transistor 120.

For example, the thickness of the first portion IS21 of the second insulating layer IS2 is greater than the thickness of the second portion IS22 of the second insulating layer IS2, and the thicknesses include the thickness in the direction perpendicular to the base substrate. For example, the thickness of the second portion IS21 of the second insulating layer IS2 is 7-8 nm, and the thickness of the second portion IS22 of the second insulating layer IS2 is 2-3 nm.

In the embodiment of the present disclosure, by increasing the thickness of the first portion IS21 of the second insulating layer IS2, for example, to more than twice the thickness of the second portion IS22, the risk of breakdown by a high voltage between the gate electrode GE2 of the second transistor 120 and the first electrode DE2 of the second transistor 120 can be reduced or avoided.

As illustrated in FIG. 9, the base substrate further includes a planarization insulating layer PL that covers the gate electrode GE2 of the second transistor 120 and the light-emitting element LE is above the planarization insulating layer PL. The planarization insulating layer PL can cover the above-mentioned pixel circuit, so that the surface of the planarization insulating layer PL is relatively flat, which is more advantageous for forming the light-emitting element LE on the planarization insulating layer PL. The planarization insulating layer PL may be silicon oxide, silicon oxynitride, silicon nitride, etc., and may be obtained by processes such as vapor deposition.

For example, in the embodiment illustrated in FIG. 9, the second transistor 120 adopts a structural design that can reduce or avoid the risk of breakdown by a high voltage, and the first transistor 110 adopts a structural design of a general MOS transistor. As illustrated in FIG. 9, the first transistor 110 includes a gate electrode GE1 in the first conductive layer 310, a first electrode DE1 and a second electrode SE1 that are both in the second conductive layer 320, a first doped region DR1 in contact with the first electrode DE1 of the first transistor 110, and a second doped region SR1 in contact with the second electrode SE1 of the first transistor 110. The first doped region DR1 of the first transistor 110 and the second doped region SR1 of the first transistor 110 are spaced apart from each other, have the same doping type, and are both in the semiconductor body 330. For example, the first transistor 110 is a P-type MOS transistor, and the doping types of the first doped region DR1 and the second doped region SR1 of the first transistor 110 are both P-type doping.

As illustrated in FIG. 9, in the first transistor 110 provided by some embodiments of the present disclosure, the first doped region DR1 and the second doped region SR1 of the first transistor 110 are in a second well WL2 in the semiconductor body 330, for example, the doping type of the second well WL2 is N-type doping.

The orthographic projection of the gate electrode GE1 of the first transistor 110 on the base substrate is in the orthographic projection of the second well WL2 on the base substrate, and a portion, which is between the first doped region DR1 of the first transistor 110 and the second doped region SR1 of the first transistor 110, of the second well WL2 constitutes the channel region of the first transistor 110.

For example, as illustrated in FIG. 9, the first transistor 110 further includes an auxiliary doped region BR, for example, the doping type of the auxiliary doped region BR of the first transistor 110 is N-type doping. The auxiliary doped region BR of the first transistor 110 is in contact with the second doped region SR1 of the first transistor 110, the auxiliary doped region BR of the first transistor 110 is electrically connected to the second electrode SE1 of the first transistor 110, and the orthographic projection of the auxiliary doped region BR of the first transistor 110 on the base substrate is in the orthographic projection of the second well WL2 on the base substrate. The auxiliary doped region BR can play an isolation role to prevent leakage.

Figure 10:
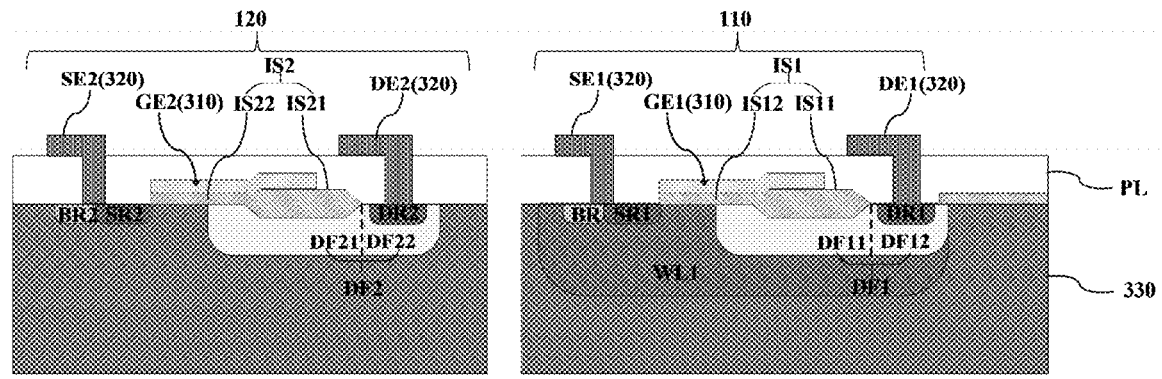
FIG. 10 is yet another schematic cross-sectional diagram of a first transistor and a second transistor provided by at least one embodiment of the present disclosure.

As illustrated in FIG. 10, in the display device provided by some embodiments of the present disclosure, both the first transistor 110 and the second transistor 120 adopt a structural design that can reduce or avoid the risk of breakdown by a high voltage. For the specific structures of the first transistor 110 and the second transistor 120, reference may be made to the corresponding description in the embodiments illustrated in FIG. 5 and FIG. 6, and details are not described herein again.

In the display device provided by the embodiments of the present disclosure, by making both the first transistor 110 and the second transistor 120 adopt structural designs that can reduce or avoid the risk of breakdown by a high voltage, the risk of breakdown by a high voltage can be reduced or avoided, thereby improving the reliability and stability of the display device.

For example, in the display device 100 provided by some embodiments of the present disclosure, the base substrate is a P-type silicon base substrate, the first transistor 110 is a P-type MOS transistor, the second transistor 120, the third transistor 130, and the driving transistor 140 are all N-type MOS transistors.

At least one embodiment of the present disclosure further provides a manufacturing method of the display device 100. The manufacturing method includes forming a pixel circuit on a base substrate.

The pixel circuit includes a driving transistor 140, a first transistor 110, and a second transistor 120.

The driving transistor 140 includes a control electrode 143, a first electrode 141 and a second electrode 142, and is configured to control a driving current, flowing through the first electrode 141 of the driving transistor 140 and the second electrode 142 of the driving transistor 140, for driving a light-emitting element to emit light according to a voltage of the control electrode 143 of the driving transistor 140.

The first transistor 110 is connected to the control electrode 143 of the driving transistor 140 and is configured to write a data signal DATA to the control electrode 143 of the driving transistor 140 in response to a first scan signal SCAN1. The second transistor 120 is connected to the control electrode 143 of the driving transistor 140 and is configured to write the data signal DATA to the control electrode 143 of the driving transistor 140 in response to a second scan signal SCAN2.

The above base substrate further includes a semiconductor body 330 that can be doped, and the above manufacturing method further includes: forming a first conductive layer 310 and a second conductive layer 320 of the base substrate on the semiconductor body 330. The first transistor 110 includes a gate electrode GE1 in the first conductive layer 310, and a first electrode DE1 and a second electrode SE1 that are in the second conductive layer 320.

The above manufacturing method further includes: forming a first doped region DR1 of the first transistor 110 in contact with the first electrode DE1 of the first transistor 110 and a second doped region SR1 of the first transistor 110 in contact with the second electrode SE1 of the first transistor 110 in the semiconductor body 330. The first doped region DR1 of the first transistor 110 and the second doped region SR1 of the first transistor 110 are spaced apart from each other, have the same doping type, and are both in the semiconductor body 330.

The above manufacturing method further includes: forming a drift doped region DF1 of the first transistor 110 with the same doping type as the second doped region SR1 of the first transistor 110 in the semiconductor body 330. The drift doped region DF1 of the first transistor 110 is in the semiconductor body 330 and spaced apart from the second doped region SR1 of the first transistor 110, the orthographic projection of the gate electrode GE1 of the first transistor 110 on the base substrate partially overlaps with the orthographic projection of the drift doped region DF1 of the first transistor 110 on the base substrate, the orthographic projection of the first doped region DR1 of the first transistor 110 on the base substrate is in the orthographic projection of the drift doped region DF1 of the first transistor 110 on the base substrate, and the doping concentration of the drift doped region DF1 of the first transistor 110 is smaller than the doping concentration of the first doped region DR1 of the first transistor 110.

The above manufacturing method further includes: forming a first insulating layer IS1 of the base substrate between the semiconductor body 330 and the first conductive layer 310. The first insulating layer IS1 includes a first portion IS11 close to the first doped region DR1 of the first transistor 110, and includes a second portion IS12 away from the first doped region DR1 of the first transistor 110. The thickness of the first portion IS11 of the first insulating layer IS1 is greater than the thickness of the second portion IS12 of the first insulating layer IS1, and the thicknesses include the thickness in the direction perpendicular to the base substrate.

At least one embodiment of the present disclosure further provides a manufacturing method of the display device 100. The manufacturing method includes forming a pixel circuit on a base substrate.

The pixel circuit includes a driving transistor 140, a first transistor 110, and a second transistor 120.

The driving transistor 140 includes a control electrode 143, a first electrode 141 and a second electrode 142, and is configured to control a driving current, flowing through the first electrode 141 of the driving transistor 140 and the second electrode 142 of the driving transistor 140, for driving a light-emitting element to emit light according to a voltage of the control electrode 143 of the driving transistor 140.

The first transistor 110 is connected to the control electrode 143 of the driving transistor 140 and is configured to write a data signal DATA to the control electrode 143 of the driving transistor 140 in response to a first scan signal SCAN1. The second transistor 120 is connected to the control electrode 143 of the driving transistor 140 and is configured to write the data signal DATA to the control electrode 143 of the driving transistor 140 in response to a second scan signal SCAN2.

The first transistor 110 includes a first active region 114, the second transistor 120 includes a second active region 124, and the driving transistor 140 includes a fourth active region 144. The above manufacturing method further includes: doping the first active region 114, the second active region 124, and the fourth active region 144 so that at least one of the doping concentration of the first active region 114 and the doping concentration of the second active region 124 is greater than the doping concentration of the fourth active region 144.

The above pixel circuit further includes a third transistor 130, the third transistor 130 is connected to the first electrode 141 of the driving transistor 140 and is configured to apply the first power supply voltage ELVDD to the first electrode 141 of the driving transistor 140 in response to the light-emitting control signal EN, and the third transistor 130 includes a third active region 134. The above manufacturing method further includes: doping the third active region 134 so that the doping concentration of the fourth active region 144 is smaller than the doping concentration of the third active region 134.

It should be noted that, for the technical effect of the manufacturing method of the display device 100 provided by the embodiment of the present disclosure, reference may be made to the corresponding description in the foregoing embodiment of the display device 100, and details are not described herein again.

The manufacturing method of the display device 100 provided by the embodiment of the present disclosure will be described below by taking the embodiment illustrated in FIG. 8 as an example.

As illustrated in FIG. 8, the semiconductor body 330 is first provided, and then N-type doping is performed in the semiconductor body 330 to form the first well WL1; then, P-type doping is performed in the first well WL1 to form the drift doped region DF1 of the first transistor 110; then, P-type doping is performed in the drift doped region DF1 of the first transistor 110 to form the first doped region DR1 of the first transistor 110, and the doping concentration of the first doped region DR1 of the first transistor 110 is greater than the doping concentration of the drift doped region DF1 of the first transistor 110; meanwhile, P-type doping is performed in the first well WL1 to form the second doped region SR1 of the first transistor 110, and N-type doping is performed to form the auxiliary doped region BR of the first transistor 110.

Then, the first insulating layer IS1 is formed on the semiconductor body 330, and the thickness of the first portion IS11 of the first insulating layer IS1 is greater than the thickness of the second portion IS12 of the first insulating layer IS1; then, the first conductive layer 310 is formed on the first insulating layer IS1, and the first conductive layer 310 includes the gate electrode GE1 of the first transistor 110.

Then, a planarization insulating layer PL is formed to cover the gate electrode GE1 of the first transistor 110; then, the via hole is formed in the planarization insulating layer PL to expose the first doped region DR1 of the first transistor 110, the second doped region SR1 of the first transistor 110, and the auxiliary doped region BR of the first transistor 110.

Finally, the second conductive layer 320 is formed. The second conductive layer 320 includes the first electrode DE1 of the first transistor 110 electrically connected to the first doped region DR1 of the first transistor 110 through the via hole in the planarization insulating layer PL described above, and the second electrode SE1 of the first transistor 110 electrically connected to the second doped region SR1 of the first transistor 110 through the via hole in the planarization insulating layer PL described above.

It should be noted that the manufacturing method of the second transistor 120 is similar to the above and is not repeated here for simplicity.

Figure 11:
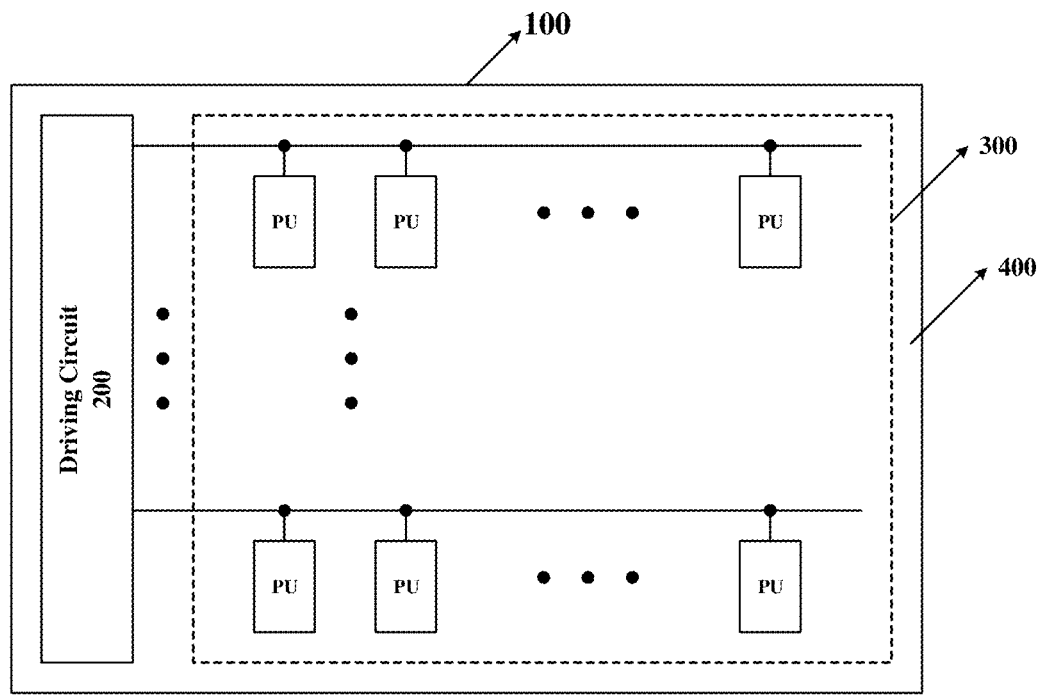
FIG. 11 is a schematic diagram of a display device provided by at least one embodiment of the present disclosure.

At least one embodiment of the present disclosure further provides a display device 100, as illustrated in FIG. 11, for example, the display device 100 includes a display panel including a plurality of pixel units PU arranged in an array in the display region 300. For example, at least one of the plurality of pixel units PU may adopt the pixel circuit in any display device 100 provided by the embodiments of the present disclosure.

For example, as illustrated in FIG. 11, the display device 100 further includes a driving circuit 200 manufactured in the base substrate, and the driving circuit 200 is configured to provide the first scan signal SCAN1, the second scan signal SCAN2, and the light-emitting control signal EN to the pixel circuits in the plurality of pixel units PU in the display device 100. For example, the driving circuit 200 is provided in a peripheral region 400 surrounding the display region 300.

For example, the display device 100 provided by the embodiment of the present disclosure may be an electronic paper, a mobile phone, a tablet computer, a television, a display, a notebook computer, a digital photo frame, a navigator and other products or members having display function.

What have been described above are only specific implementations of the present disclosure, the protection scope of the present disclosure is not limited thereto. The protection scope of the present disclosure should be based on the protection scope of the claims.

What is claimed is:

1. A display device, comprising a base substrate and at least one pixel circuit provided on the base substrate, wherein
    the pixel circuit comprises a driving transistor, a first transistor, and a second transistor;
    the driving transistor comprises a control electrode, a first electrode, and a second electrode, and is configured to control a driving current, flowing through the first electrode of the driving transistor and the second electrode of the driving transistor, for driving a light-emitting element to emit light according to a voltage of the control electrode of the driving transistor;
    the first transistor is connected to the control electrode of the driving transistor, and is configured to write a data signal to the control electrode of the driving transistor in response to a first scan signal;
    the second transistor is connected to the control electrode of the driving transistor, and is configured to write the data signal to the control electrode of the driving transistor in response to a second scan signal; and
    the first transistor comprises a first active region, the second transistor comprises a second active region, the driving transistor comprises a fourth active region, the pixel circuit further comprises a third transistor, and the third transistor is connected to the first electrode of the driving transistor, and is configured to apply a first power supply voltage to the first electrode of the driving transistor in response to a light-emitting control signal; and the third transistor comprises a third active region, and both of a doping concentration of the first active region and a doping concentration of the second active region are larger than both a doping concentration of the third active region and a doping concentration of the fourth active region.

2. The display device according to claim 1, wherein the doping concentration of the fourth active region is smaller than the doping concentration of the third active region.

3. The display device according to claim 1, wherein the doping concentration of the fourth active region is 4 orders of magnitude smaller than the doping concentration of the third active region.

4. The display device according to claim 3, wherein the doping concentration of the third active region comprises $10^{17}$ cm$^{-3}$, the doping concentration of the fourth active region comprises $10^{13}$ cm$^{-3}$.

5. The display device according to claim 1, wherein
    the doping concentration of the first active region and the doping concentration of the second active region are both 3 orders of magnitude greater than the doping concentration of the third active region.

6. The display device according to claim 5, wherein
    the doping concentration of the third active region comprises $10^{17}$ cm$^{-3}$, and the doping concentration of the first active region and the doping concentration of the second active region both comprise $10^{20}$ cm$^{-3}$.

7. The display device according to claim 1, wherein the first transistor is a MOS transistor with a first semiconductor type, the second transistor, the third transistor, and the driving transistor are all MOS transistors with a second semiconductor type, and a doping type of the first semiconductor type is opposite to a doping type of the second semiconductor type.

8. The display device according to claim 1, wherein
    a direction from a first electrode of the first transistor to a second electrode of the first transistor is a first direction, a direction from a first electrode of the second transistor to a second electrode of the second transistor is a second direction, a direction from a first electrode of the third transistor to a second electrode of the third transistor is a third direction, and a direction from the first electrode of the driving transistor to the second electrode of the driving transistor is a fourth direction; and
    at least one of the first direction, the second direction, and the third direction intersects with the fourth direction.

9. The display device according to claim 1, wherein
    a first electrode of the first transistor and a first electrode of the second transistor are connected to obtain a common electrode, and are connected to the control electrode of the driving transistor through the common electrode;
    a control electrode of the first transistor is configured to receive the first scan signal, and a second electrode of the first transistor is configured to receive the data signal;
    a control electrode of the second transistor is configured to receive the second scan signal, and a second electrode of the second transistor is configured to receive the data signal;
    a control electrode of the third transistor is configured to receive the light-emitting control signal, a first electrode of the third transistor is configured to receive the first power supply voltage, and a second electrode of the third transistor is connected to the first electrode of the driving transistor; and
    the second electrode of the driving transistor is configured to be connected to the light-emitting element.

10. The display device according to claim 1, further comprising a first scan signal line for transmitting the first scan signal and a second scan signal line for transmitting the second scan signal, wherein
    an orthographic projection of the first scan signal line on the base substrate is parallel to an orthographic projection of the second scan signal line on the base substrate.

11. The display device according to claim 10, wherein
    a direction from the first electrode of the driving transistor to the second electrode of the driving transistor is a fourth direction, and an extension direction of the first scan signal line and an extension direction of the second scan signal line are both parallel to the fourth direction.

12. The display device according to claim 10, further comprising a first power supply voltage line for transmitting a first power supply voltage and a light-emitting control line for transmitting a light-emitting control signal, wherein
an extension direction of a part of the first power supply voltage line and an extension direction of a part of the light-emitting control line are parallel to the fourth direction, and
the orthographic projection of the first scan signal line on the base substrate, the orthographic projection of the second scan signal line on the base substrate, an orthographic projection of the first power supply voltage line on the base substrate, and an orthographic projection of the light-emitting control line on the base substrate are sequentially arranged in a direction perpendicular to the fourth direction.

13. The display device according to claim 12, further comprising a second power supply voltage line for transmitting a second power supply voltage, wherein
the first transistor is electrically connected to the second power supply voltage line to receive the second power supply voltage.

14. The display device according to claim 13, wherein an orthographic projection of the second power supply voltage line on the base substrate is between the orthographic projection of the first power supply voltage line on the base substrate and the orthographic projection of the light-emitting control line on the base substrate, and an extension direction of a part of the second power supply voltage line is parallel to the fourth direction.

15. The display device according to claim 12, further comprising a first transfer electrode provided at a first side of the light-emitting control line, and a second transfer electrode extending from the first side of the light-emitting control line to a second side of the light-emitting control line, wherein
an orthographic projection of the second transfer electrode on the base substrate crosses the orthographic projection of the light-emitting control line on the base substrate,
two ends of the first transfer electrode are respectively electrically connected to a first electrode of the first transistor and a first electrode of the second transistor,
the first transfer electrode is electrically connected to the second transfer electrode, and
the second transfer electrode is electrically connected to the control electrode of the driving transistor.

16. The display device according to claim 15, wherein an extension direction of the second transfer electrode is perpendicular to an extension direction of the first transfer electrode, and is perpendicular to the fourth direction.

17. The display device according to claim 13, wherein
an orthographic projection of a first active region of the first transistor on the base substrate and an orthographic projection of a second active region of the second transistor on the base substrate are both between the orthographic projection of the second scan signal line on the base substrate and the orthographic projection of the light-emitting control line on the base substrate;
the orthographic projection of the first active region of the first transistor on the base substrate intersects with the orthographic projection of the first power supply voltage line on the base substrate, and the orthographic projection of the first active region of the first transistor on the base substrate intersects with the orthographic projection of the second power supply voltage line on the base substrate; and
the orthographic projection of the second active region of the second transistor on the base substrate intersects with the orthographic projection of the first power supply voltage line on the base substrate, and the orthographic projection of the second active region of the second transistor on the base substrate intersects with the orthographic projection of the second power supply voltage line on the base substrate.

18. A manufacturing method of a display device, comprising:
forming a pixel circuit on a base substrate, wherein
the pixel circuit comprises a driving transistor, a first transistor, and a second transistor;
the driving transistor comprises a control electrode, a first electrode, and a second electrode, and is configured to control a driving current, flowing through the first electrode of the driving transistor and the second electrode of the driving transistor, for driving a light-emitting element to emit light according to a voltage of the control electrode of the driving transistor;
the first transistor is connected to the control electrode of the driving transistor, and is configured to write a data signal to the control electrode of the driving transistor in response to a first scan signal;
the second transistor is connected to the control electrode of the driving transistor, and is configured to write the data signal to the control electrode of the driving transistor in response to a second scan signal;
the first transistor comprises a first active region, the second transistor comprises a second active region, the driving transistor comprises a fourth active region; and
the pixel circuit further comprises a third transistor, and the third transistor is connected to the first electrode of the driving transistor, and is configured to apply a first power supply voltage to the first electrode of the driving transistor in response to a light-emitting control signal; and the third transistor comprises a third active region, and the manufacturing method further comprises doping the first active region, the second active region, the third active region and the fourth active region so that both of a doping concentration of the first active region and a doping concentration of the second active region are larger than both a doping concentration of the third active region and a doping concentration of the fourth active region.

19. The manufacturing method according to claim 18, further comprises:
doping the third active region so that the doping concentration of the fourth active region is smaller than a doping concentration of the third active region.

* * * * *